US009837524B2

(12) United States Patent
Miyake et al.

(10) Patent No.: US 9,837,524 B2
(45) Date of Patent: Dec. 5, 2017

(54) SEMICONDUCTOR DEVICE AND METHOD OF MANUFACTURING SEMICONDUCTOR DEVICE

(71) Applicant: Renesas Electronics Corporation, Koutou-ku, Tokyo (JP)

(72) Inventors: Shinichi Miyake, Ibaraki (JP); Tatsuo Nakayama, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/340,956

(22) Filed: Nov. 1, 2016

(65) Prior Publication Data

US 2017/0054016 A1    Feb. 23, 2017

Related U.S. Application Data

(63) Continuation of application No. 14/960,431, filed on Dec. 6, 2015, now Pat. No. 9,508,842.

(30) Foreign Application Priority Data

Dec. 10, 2014    (JP) .................................. 2014-249833

(51) Int. Cl.
*H01L 21/338*    (2006.01)
*H01L 29/778*    (2006.01)
(Continued)

(52) U.S. Cl.
CPC ...... *H01L 29/7787* (2013.01); *H01L 29/2003* (2013.01); *H01L 29/4236* (2013.01);
(Continued)

(58) Field of Classification Search
CPC ............. H01L 29/7787; H01L 29/4236; H01L 29/66462; H01L 29/7783; H01L 29/432;
(Continued)

(56) References Cited

U.S. PATENT DOCUMENTS 7,939,391 B2    5/2011 Suh et al.
2009/0206371 A1    8/2009 Oka
(Continued)

FOREIGN PATENT DOCUMENTS

| EP | 2 296 173 A1 | 3/2011 |
| JP | 2012-156164 A | 8/2012 |
| WO | WO 2014/167825 A1 | 10/2014 |

OTHER PUBLICATIONS

Extended European search report for European Patent Application No. 15197623.0, dated Aug. 12, 2016.

*Primary Examiner* — Thinh T Nguyen

(74) *Attorney, Agent, or Firm* — Shapiro, Gabor and Rosenberger, PLLC

(57) ABSTRACT

A semiconductor device includes a buffer layer, a channel layer, a barrier layer, and a gate electrode over a substrate, the gate electrode being disposed in a first opening with a gate insulating film in between, the first opening running up to the middle of the channel layer through the barrier layer. The concentration of two-dimensional electron gas in a first region on either side of a second opening that will have a channel is controlled to be lower than the concentration of two-dimensional electron gas in a second region between an end of the first region and a source or drain electrode. The concentration of the two-dimensional electron gas in the first region is thus decreased, thereby the conduction band-raising effect of polarization charge is prevented from being reduced. This prevents a decrease in threshold potential, and thus improves normally-off operability.

9 Claims, 28 Drawing Sheets

(51) Int. Cl.
- *H01L 29/66* (2006.01)
- *H01L 29/423* (2006.01)
- *H01L 29/20* (2006.01)
- *H01L 23/29* (2006.01)
- *H01L 29/861* (2006.01)
- *H01L 23/31* (2006.01)
- *H01L 29/43* (2006.01)

(52) U.S. Cl.
CPC .... *H01L 29/66462* (2013.01); *H01L 29/7783* (2013.01); *H01L 23/291* (2013.01); *H01L 23/3171* (2013.01); *H01L 29/432* (2013.01); *H01L 29/7785* (2013.01); *H01L 29/861* (2013.01); *H01L 2924/0002* (2013.01)

(58) Field of Classification Search
CPC ............... H01L 23/291; H01L 29/7785; H01L 2924/0002; H01L 29/861; H01L 23/3171

USPC .... 257/76, 183, 192, 194, E21.09, E29.188; 438/172, 46, 285, 590

See application file for complete search history.

(56) References Cited

U.S. PATENT DOCUMENTS

| | | |
|---|---|---|
| 2010/0155720 A1 | 6/2010 | Kaneko |
| 2011/0068371 A1 | 3/2011 | Oka |
| 2012/0217543 A1* | 8/2012 | Minoura ............. H01L 21/2654 257/190 |
| 2013/0248874 A1 | 9/2013 | Kuraguchi |
| 2014/0191288 A1* | 7/2014 | Kotani .............. H01L 21/02112 257/194 |
| 2016/0043209 A1 | 2/2016 | Oyama |

* cited by examiner

FIG. 4
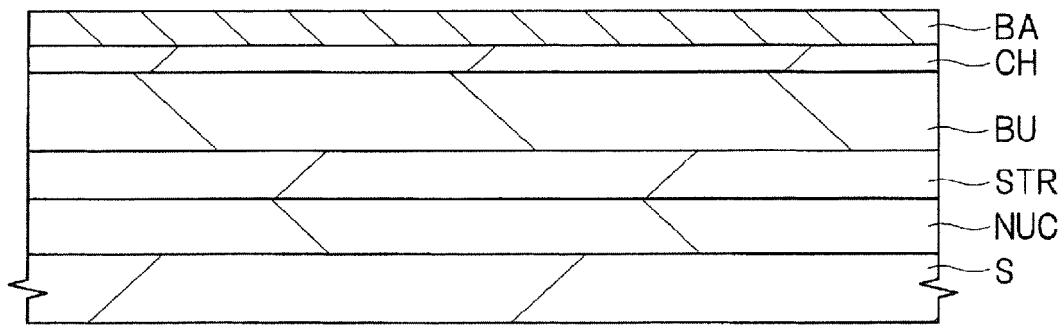
FIG. 5
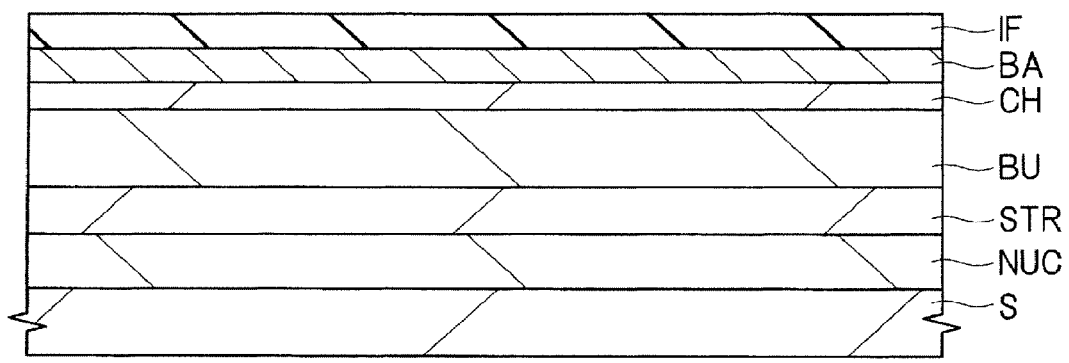

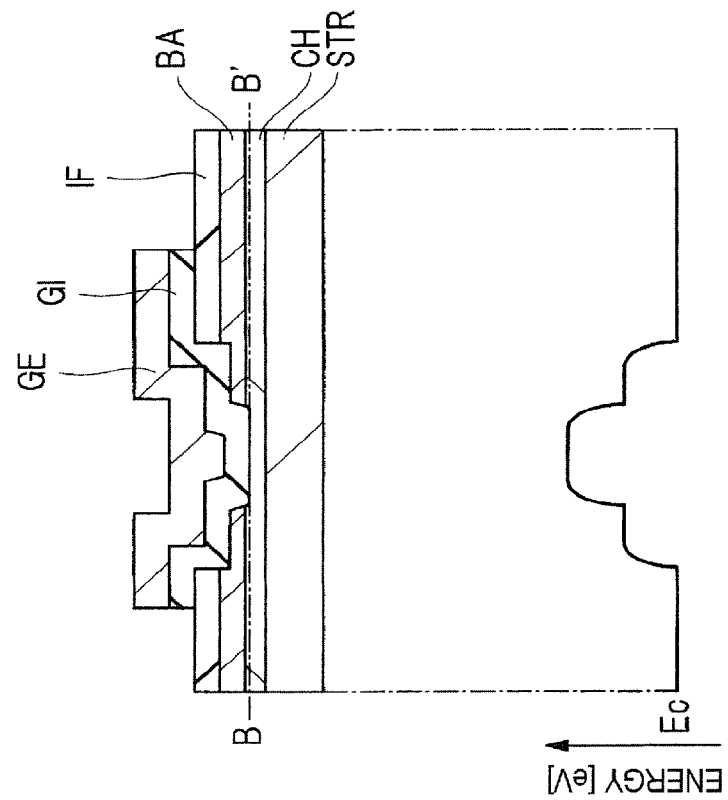
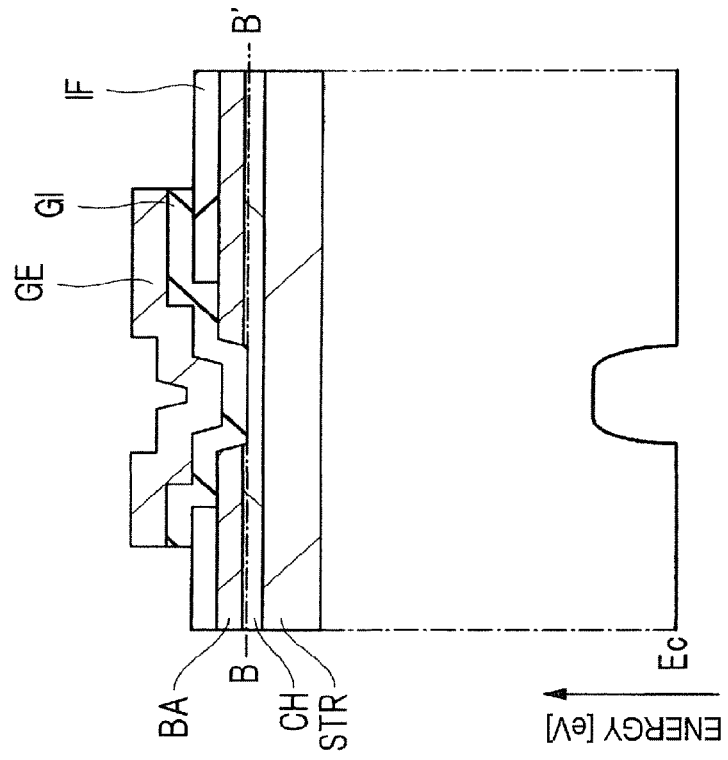

FIG. 21
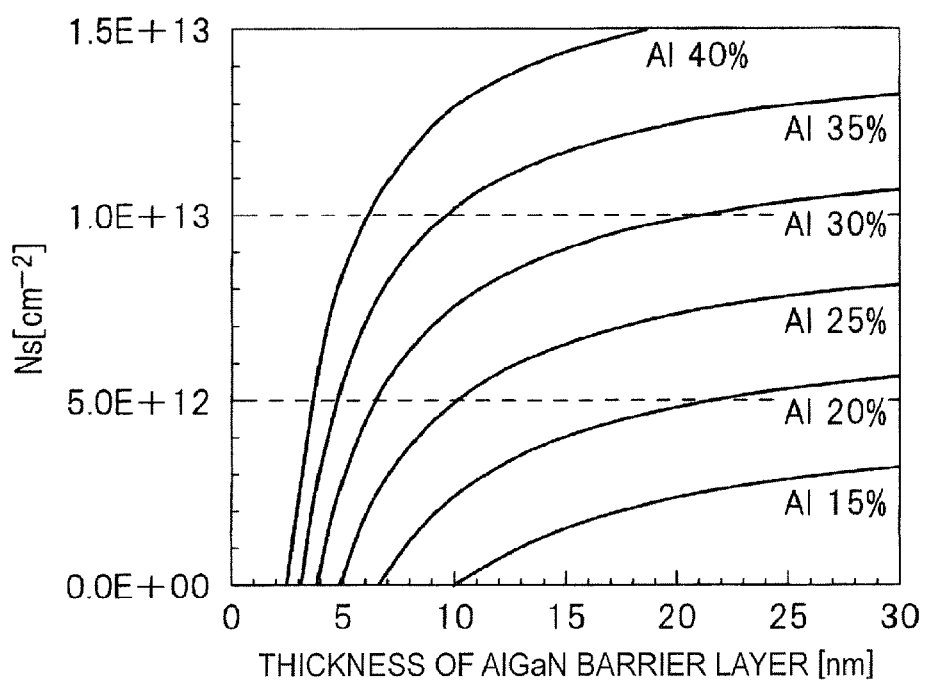
FIG. 22
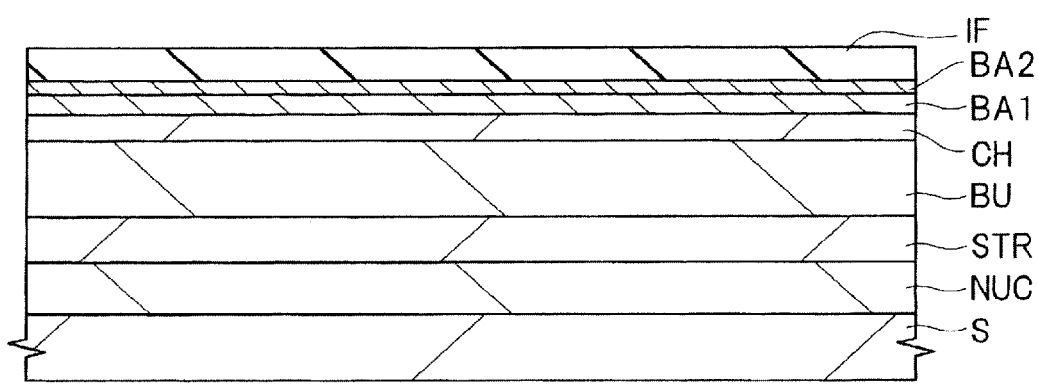

SEMICONDUCTOR DEVICE AND METHOD OF MANUFACTURING SEMICONDUCTOR DEVICE

CROSS-REFERENCE TO RELATED APPLICATIONS

The disclosure of Japanese Patent Application No. 2014-249833 filed on Dec. 10, 2014 including the specification, drawings and abstract is incorporated herein by reference in its entirety.

BACKGROUND

The present invention relates to a semiconductor device and a method of manufacturing the semiconductor device. For example, the method is preferably used in a semiconductor device including nitride semiconductor.

Semiconductor devices each including a III-V compound having a bandgap wider than silicon (Si) are now the subject of interest. Among them, a MISFET including gallium nitride (GaN) has advantages, such as 1) a high dielectric breakdown field, 2) high electron saturation velocity, 3) large thermal conductivity, 4) good-heterojunction formability between AlGaN and GaN, and 5) a nonpoisonous and safe material.

For example, Japanese Unexamined Patent Application Publication No. 2012-156164 discloses a heterojunction semiconductor device having a first recess portion, a second recess portion shallower than the first recess portion, and a gate portion.

SUMMARY

The inventors have earnestly investigated through research and development to improve properties of the semiconductor device including such nitride semiconductor. In that process, they have investigated the properties of the semiconductor device including the nitride semiconductor, and have found that when Al concentration of a barrier layer is increased to decrease ON resistance, threshold voltage is lowered.

Other issues and novel features will be clarified from the description of this specification and the accompanying drawings.

While some embodiments are disclosed herein, a typical one is briefly summarized as follows.

A semiconductor device demonstrated in one embodiment disclosed in this application includes a first nitride semiconductor layer, a second nitride semiconductor layer, and a third nitride semiconductor layer provided in this order over a substrate, and a gate electrode disposed in a first opening with a gate insulating film in between. The first opening runs up to the middle of the second nitride semiconductor layer through the third nitride semiconductor layer. A first region is disposed on either side of the first opening. The concentration of two-dimensional electron gas in the first region on a side close to the first electrode is lower than the concentration of two-dimensional electron gas in a second region between an end of the first region on the side close to the first electrode and the first electrode.

A method of manufacturing a semiconductor device demonstrated in one embodiment disclosed in this application includes a step of forming a first nitride semiconductor layer, a second nitride semiconductor layer, and a third nitride semiconductor layer in this order over a substrate. The method further includes a step of forming a trench having a first opening that runs up to the middle of the second nitride semiconductor layer through the third nitride semiconductor layer in a first region, and a second opening that runs up to the middle of the third nitride semiconductor layer in a second region. The method further includes a step of forming a gate electrode in the trench with a gate insulating film in between.

According to the semiconductor device demonstrated below in the typical embodiment disclosed in this application, properties of the semiconductor device can be improved.

According to the method of manufacturing the semiconductor device demonstrated below in the typical embodiment disclosed in this application, a semiconductor device having good properties can be manufactured.

BRIEF DESCRIPTION OF THE DRAWINGS

FIG. 4 is a sectional view illustrating a manufacturing step of the semiconductor device of the first embodiment.

FIG. 5 is a sectional view illustrating a manufacturing step following FIG. 4 of the semiconductor device of the first embodiment.

FIG. 19A includes a sectional view of a semiconductor device of a comparative example, and a band diagram in a trench portion. FIG. 19B includes a sectional view of a semiconductor device of application 2 of the first embodiment, and a band diagram in a trench portion.

FIG. 21 is a graph illustrating a relationship between Al concentration of a barrier layer and $N_s$.

FIG. 22 is a sectional view illustrating a manufacturing step of the semiconductor device of the second embodiment.

DETAILED DESCRIPTION

Although each of the following embodiments may be dividedly described in a plurality of sections or embodiments for convenience as necessary, they are not unrelated to one another except for the particularly defined case, and are in a relationship where one is a modification, an application, a detailed explanation, a supplementary explanation, or the like of part or all of another one. In each of the following embodiments, when the number of elements and the like (including the number, a numerical value, amount, a range, etc.) are mentioned, the number is not limited to a specified number except for the particularly defined case and for the case where the number is principally clearly limited to the specified number. In other words, the number may be not less than or not more than the specified number.

In each of the following embodiments, it will be appreciated that a constitutional element (including an element step etc.) of the embodiment is not necessarily indispensable except for the particularly defined case and for the case where the constitutional element is probably indispensable in principle. Similarly, in each of the following embodiments, description on a shape of a constitutional element etc., a positional relationship, and the like is intended to include an element having a shape or the like substantially similar to that of the constitutional element except for the particularly defined case and for the case where such an element is probably not included in principle. The same holds true for the above-described number and the like (including the number, a numerical value, amount, a range, etc.).

Hereinafter, some embodiments will be described in detail with reference to the accompanying drawings. In all drawings for explaining the embodiments, components having the same function are designated by the same or relevant numeral, and duplicated description is omitted. When a plurality of similar components (portions) exist, a sign is added to a generic symbol to indicate an individual or specific portion. In the following embodiments, an equivalent or a similar portion is not repeatedly described except for a particularly required case.

A sectional view for explaining each embodiment may not be hatched for better viewability. Furthermore, a plan view may also be hatched for better viewability.

In the sectional and plan views, size of each portion does not correspond to that of an actual device, and a specific portion may be shown relatively large for better viewability.

When a sectional view corresponds to a plan view, a specific portion may also be shown relatively large for better viewability.

First Embodiment

A semiconductor device of the first embodiment is now described in detail with reference to the accompanying drawings.

Structural Explanation

Figure 1:
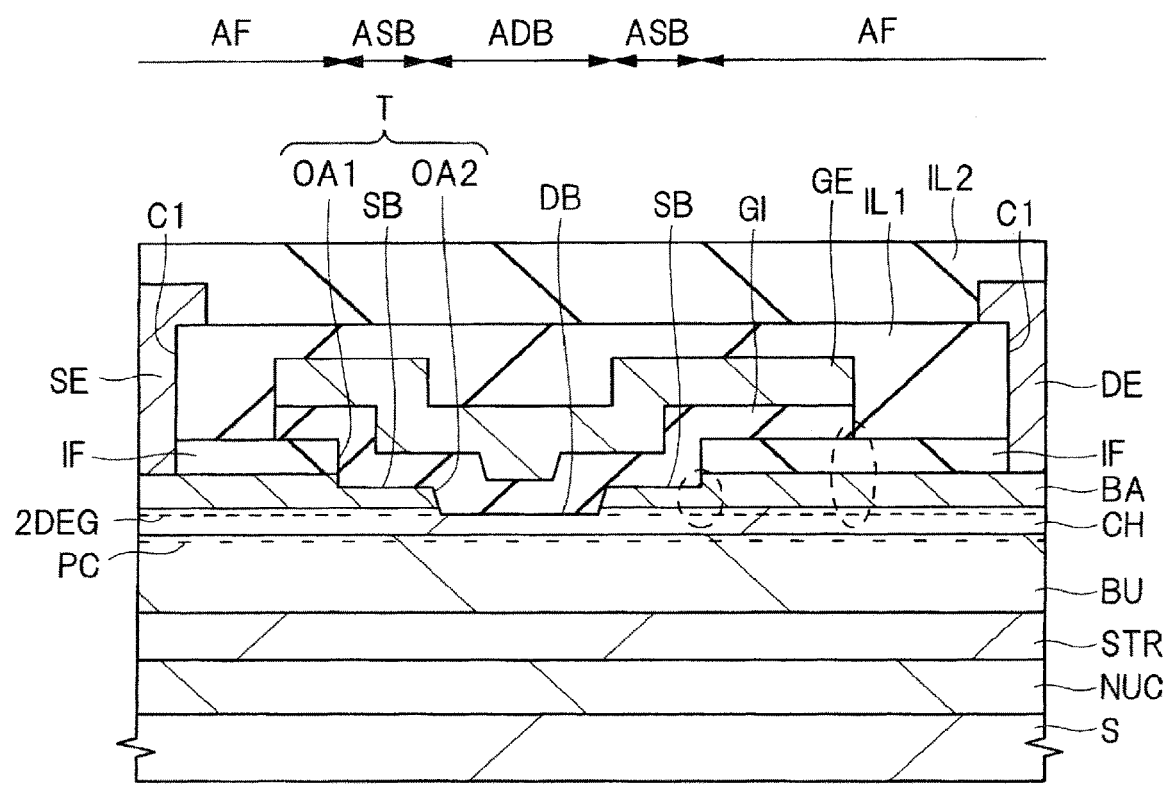
FIG. 1 is a sectional view illustrating a configuration of a semiconductor device of a first embodiment.

FIG. 1 is a sectional view illustrating a configuration of a semiconductor device of the first embodiment. The semiconductor device (semiconductor element) of the first embodiment illustrated in FIG. 1 is a metal-insulator-semiconductor (MIS) field effect transistor (FET) including nitride semiconductor. The semiconductor device can be used as a high-electron-mobility transistor (HEMT) type of power transistor. The semiconductor device of the first embodiment is a so-called recessed-gate semiconductor device.

The semiconductor device of the first embodiment has a nucleation layer NUC, a strain relaxation layer SIR, a buffer layer BU, a channel layer (electron transit layer) CH, and a barrier layer BA provided in this order on a substrate S. An insulating film IF is provided on the barrier layer BA.

A gate electrode GE is provided within a trench T including an opening OA1 and an opening OA2, and provided on the insulating film IF with a gate insulating film GI in between. The trench T has shallow bottom portions (shallow trench portions) SB and a deep bottom portion (deep trench portion) DB. Each shallow bottom portion SB is provided on either side of the deep bottom portion DB. A single shallow bottom portion SB may be provided so as to enclose the deep bottom portion DB (see FIG. 2). In other words, the gate electrode GE is provided over the opening OA2 and the shallow bottom portion SB (region ASB described later).

Figure 6:
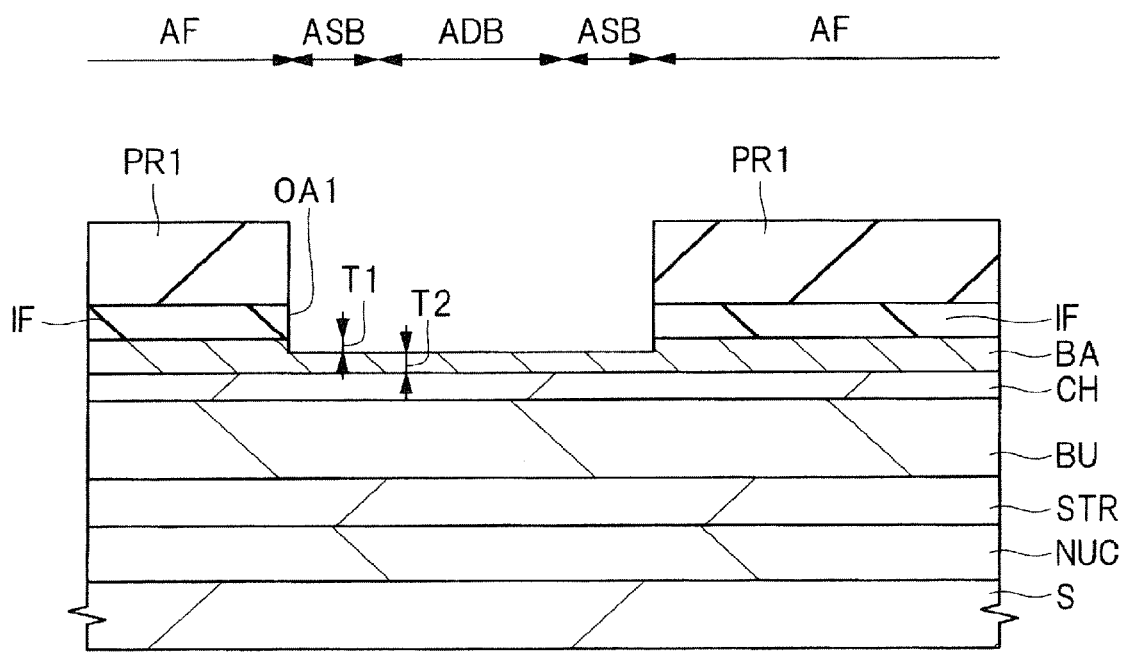
FIG. 6 is a sectional view illustrating a manufacturing step following FIG. 5 of the semiconductor device of the first embodiment.

The opening OA1 runs up to the middle of the barrier layer BA through the insulating film IF (see FIG. 6). The bottom face (bottom portion) of the opening OA1 corresponds to the shallow bottom portion SB. The shallow bottom portion SB is located within the barrier layer BA. In other words, the barrier layer BA is exposed from the shallow bottom portion SB. In other words, the barrier layer BA remains under the shallow bottom portion SB. The opening OA2 runs up to the middle of the channel layer CH through the insulating film IF and the barrier layer BA (see FIG. 7). The bottom face (bottom portion) of the opening OA2 corresponds to the deep bottom portion DB. The deep bottom portion DB is located within the channel layer CH. In other words, the channel layer CH is exposed from the deep bottom portion DB. The formation region of the shallow bottom portion SB is referred to as region ASB. The formation region of the deep bottom portion DB is referred to as region ADB. A region having no trench T (region with the barrier layer BA being unetched) is referred to as region AF.

Two-dimensional electron gas 2DEG is generated in the channel layer CH in the vicinity of the interface between the channel layer CH and the barrier layer BA. When a positive potential (threshold potential) is applied to the gate electrode GE, a channel is formed in the vicinity of the interface between the gate insulating film GI and the channel layer CH. The two-dimensional electron gas 2DEG is formed by the following mechanism. The nitride semiconductors (gallium nitride semiconductors in this embodiment) configuring the channel layer CH and the barrier layer BA are different in bandgap and in electron affinity from each other.

Hence, a well-type potential is formed at a junction plane of such semiconductors. Electrons are accumulated in the well-type potential, thereby the two-dimensional electron gas 2DEG is generated in the vicinity of the interface between the channel layer CH and the barrier layer BA (see FIG. 1).

The two-dimensional electron gas 2DEG generated in the vicinity of the interface between the channel layer CH and the barrier layer BA is separated by the opening OA2 having the gate electrode GE therein. Hence, the semiconductor device of the first embodiment maintains OFF during application of no positive potential (threshold potential) to the gate electrode GE, and maintains ON during application of the positive potential (threshold potential) thereto. In this way, the semiconductor device performs normally-off operation.

The buffer layer BU is thus provided under the channel layer CH, thereby polarization charge (negative fixed charge) PC is generated in the buffer layer BU in the vicinity of the interface between the channel layer CH and the buffer layer BU. The polarization charge PC raises a conduction band, and thus allows the threshold potential to rise to a positive side (see FIG. 15). This improves normally-off operability.

A source electrode SE is provided on the barrier layer BA on one side (on the left side in FIG. 1) of the gate electrode GE. A drain electrode DE is provided on the barrier layer BA on the other side (on the right side in FIG. 1) of the gate electrode GE. The source electrode SE and the drain electrode DE are each disposed in and on a contact hole C1 provided in an interlayer insulating film IL1. The source electrode SE and the drain electrode DE are covered with an interlayer insulating film IL2.

The semiconductor device of the first embodiment is configured such that the thin barrier layer BA remains in the shallow bottom portion SB on either side of the deep bottom portion DB (the opening OA1, a region where the channel is induced, or the channel region), which decreases the concentration of the two-dimensional electron gas 2DEG below the shallow bottom portion SB. The concentration of the two-dimensional electron gas 2DEG below the shallow bottom portion SB is thus decreased, thereby the conduction band-raising effect of the polarization charge PC is prevented from being reduced. This prevents a decrease in threshold potential, and thus improves normally-off operability.

The provision of the shallow bottom portion SB allows individual adjustment of the concentration of the two-dimensional electron gas 2DEG between the region ASB having the shallow bottom portion SB therein and the region AF having no trench T. Hence, the concentration of the two-dimensional electron gas 2DEG in the region AF can be increased by, for example, increasing the Al concentration of the barrier layer, and thus ON resistance (access resistance) can be decreased.

Such effects are described in detail later (see FIGS. 13 to 17).

In the shallow bottom portion SB, application of a threshold potential to the gate electrode GE induces a channel. This allows ON resistance to be reduced.

The provision of the shallow bottom portion SB divides the electric-field concentration portion below the gate electrode GE into two (see round portions enclosed by broken lines in FIG. 1). This relaxes electric-field concentration, and thus increases the gate breakdown voltage.

Figure 2:
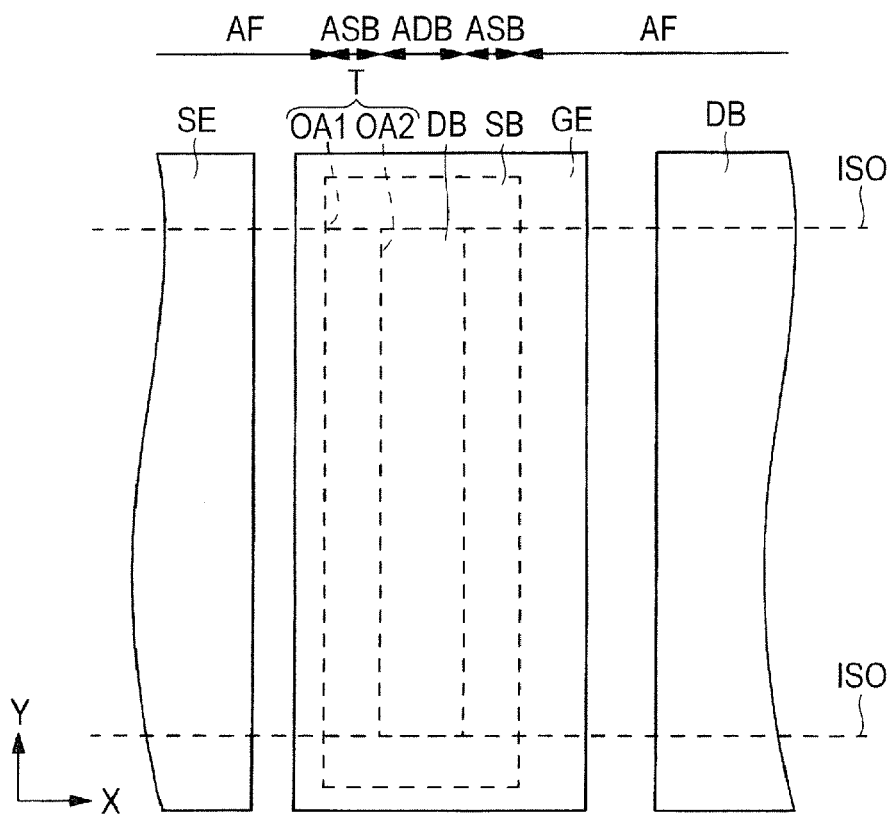
FIG. 2 is a plan view illustrating the configuration of the semiconductor device of the first embodiment.
Figure 3:
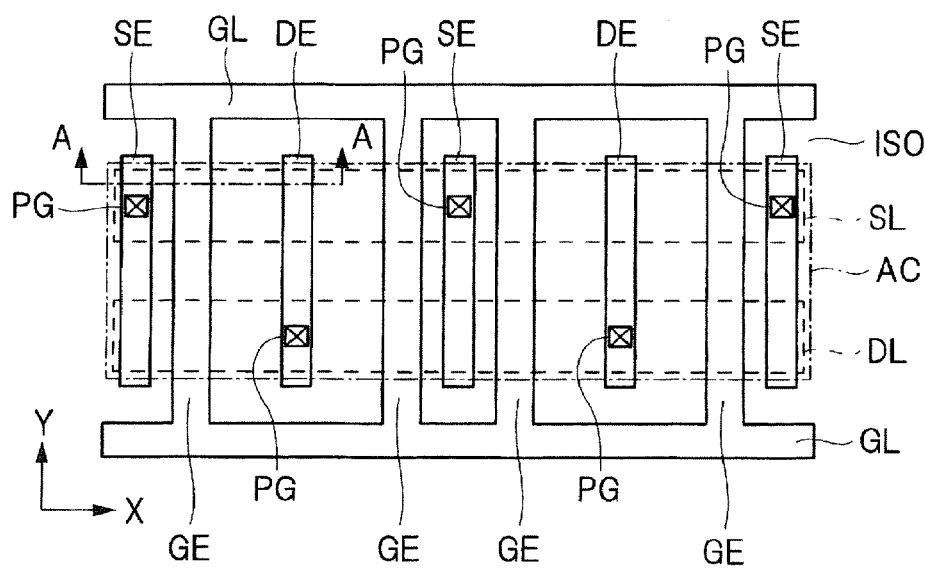
FIG. 3 is a plan view illustrating the configuration of the semiconductor device of the first embodiment.

The semiconductor device of the first embodiment is described further in detail with reference to FIGS. 1 to 3.

FIGS. 2 and 3 are each a plan view illustrating the configuration of the semiconductor device of the first embodiment. FIG. 2 is a plan view of the gate electrode and its neighborhood. FIG. 3 is an exemplary layout of a plurality of gate electrodes being arranged. For example, FIG. 1 corresponds to an A-A section in FIG. 3.

As illustrated in FIG. 2, a planer shape of an overhead view (hereinafter, referred to as "planer shape") of the gate electrode GE is a rectangular shape (quadrilateral shape) having a long side in the Y direction. As described above, the gate electrode GE is disposed within the trench (including the openings OA1 and OA2) T and on the insulating film IF with the gate insulating film GI in between (see FIG. 1). The opening OA2 is disposed in the center of the gate electrode GE within a formation region of the gate electrode GE (gate electrode formation region) and has a rectangular planar shape having a long side in the Y direction. The opening OA1 is disposed so as to enclose the formation region of the opening OA2 within the formation region of the gate electrode GE, and has a rectangular planar shape having a long side in the Y direction.

The source electrode SE is provided on one side of the gate electrode GE. For example, the source electrode SE has a rectangular planar shape having a long side in the Y direction. The drain electrode DE is provided on the other side of the gate electrode GE. The drain electrode DE has a rectangular planar shape having along side in the Y direction, for example.

While the gate electrode GE, source electrode SE, and the drain electrode DE may be disposed in any layout without limitation, such electrodes are disposed as illustrated in FIG. 3, for example. The gate electrode GE, the source electrode SE, and the drain electrode DE are disposed on a rectangular active region AC having a long side in the X direction. The active region AC is enclosed into a compartment by an element isolation region ISO.

As described above, the source electrodes SE and the drain electrodes DE are each a rectangular shape having a long side in the Y direction. The source electrodes SE and the drain electrodes DE are alternately disposed side by side in the X direction. The gate electrode GE is disposed between the source electrode SE and the drain electrode DE. For example, a first end (on an upper side in the drawing) of each of the gate electrodes GE is coupled to a gate line GL extending in the X direction. A second end (on a lower side in the drawing) of each of the gate electrodes GE is coupled to another gate line GL extending in the X direction. One of the two gate lines GL may be omitted so that the gate electrodes GE and the gate lines GL generally have a comblike shape. The source electrodes SE are each coupled to a source line SL extending in the X direction via a plug (connection) PG. The drain electrodes DE are each coupled to a drain line DL extending in the X direction via a plug (connection) PG. FIG. 1 omits illustration of layers above the interlayer insulating film IL2, such as the plugs PG, the source line SL, and the drain line DL.

For example, a semiconductor substrate including silicon (Si) is used as the substrate S. A substrate including nitride semiconductor such as GaN, or a substrate including AlN, SiC, or sapphire may be used as the substrate S.

The nucleation layer NUC is provided for crystalline nucleation for growth of an upper layer. In addition, the nucleation layer NUC prevents diffusion of a constitutional element (for example, Ga) of an upper layer, and thus prevents the substrate S from being degenerated. For example, an aluminum nitride (AlN) layer is used as the nucleation layer NUC. When a GaN substrate is used as the substrate S, the nucleation layer NUC may not provided.

The strain relaxation layer STR relaxes stress on the substrate S, and suppresses occurrence of a warp or crack in the substrate S. Examples of the strain relaxation layer SIR include a superlattice structure including multilayered films configured of repeatedly stacked AlN/GaN films each including a gallium nitride (GaN) layer and an aluminum nitride (AlN) layer.

As described above, the buffer layer BU is provided to raise the conduction band through polarization of the portion directly below the channel. For example, an AlGaN layer is used as the buffer layer BU. The buffer layer BU is not intentionally doped with any impurity. An InAlN layer is also used as the buffer layer BU.

For example, a GaN layer is used as the channel layer CH. The material for the channel layer CH further includes AlN and InN. A mixed crystal of such nitride semiconductors may be used. Although the undoped channel layer CH is used in the first embodiment, the channel layer CH may be appropriately doped with an impurity depending on applications. The dopant includes an n-type impurity and a p-type impurity.

A nitride semiconductor used for the channel layer CH must have an electron affinity larger than each of the buffer layer BU and the barrier layer BA.

For example, an AlGaN layer is used as the barrier layer BA. When the AlGaN layer is used as each of the buffer layer BU and the barrier layer BA, Al concentration is larger in the barrier layer BA. For example, the Al concentrations (x, z) of the buffer layer BU (represented as $Al_xGa_{1-x}N$) and the barrier layer BA (represented as $Al_zGa_{1-z}N$) have a relationship of x<z. The buffer layer BU has an electron affinity larger than the barrier layer BA. The material for the barrier layer BA further includes InAlN. In addition, the barrier layer BA may include a multilayer-structured layer including films having different Al concentrations being stacked. The material for the barrier layer BA includes GaN, AlN, and InN, and a mixed crystal thereof (for example, AlGaN, InAlGaN).

For example, a silicon nitride film is used as the insulating film IF. Another insulating film (for example, a silicon oxide film or a silicon oxynitride film) may also be used.

An aluminum oxide ($Al_2O_3$) film is used as the gate insulating film GI. Another insulating film may also be used as the gate insulating film GI. A multilayered structure including several types of insulating films may also be used.

A titanium nitride (TiN) film is used as the gate electrode GE. Another conductive film may also be used as the gate electrode GE. For example, a polycrystalline silicon film doped with an impurity such as boron (B) or phosphorous (P) may be used. Furthermore, a metal film including Ti, Al, Ni, and Au, or a compound film (metal silicide film) of such a metal and Si may also be used. A nitride film of the metal including Ti, Al, Ni, and Au may also be used.

For example, a silicon oxide film is used as the interlayer insulating film IL1. Another insulating film or a multilayered structure including several types of insulating films may also be used.

The source electrode SE and the drain electrode DE are each configured of the conductive film provided in and on the contact hole C1. A multilayered film including a TiN film and an upper-layer Al film is used as each of the source electrode SE and the drain electrode DE. The material for each of the source electrode SE and the drain electrode DE may be any material that will be in ohmic contact with the nitride semiconductor layer (barrier layer BA) on the bottom of the contact hole C1. The source electrode SE and the drain electrode DE may each be configured of a material including a metal film such as a film of Ti, Al, molybdenum (Mo), niobium (Nb), or vanadium (V). The material further includes a mixture (alloy) of such metals, a compound film (metal silicide film) of such a metal and Si, and a nitride of such a metal. A multilayered film including such materials may also be used.

For example, a silicon oxide film is used as the interlayer insulating film IL2 on the source electrode SE or the drain electrode DE.

Description of Manufacturing Method

A method of manufacturing the semiconductor device of the first embodiment is now described with reference to FIGS. 4 to 12, while the configuration of the semiconductor device is further clarified. FIGS. 4 to 12 are each a sectional view illustrating a manufacturing step of the semiconductor device of the first embodiment.

As illustrated in FIG. 4, the nucleation layer NUC, the strain relaxation layer STR, and the buffer layer BU are sequentially formed on the substrate S. For example, a semiconductor substrate including silicon (Si), the (111) face of which is exposed, is used as the substrate S. Then, for example, an aluminum nitride (AlN) layer as the nucleation layer NUC is heteroepitaxially grown on the substrate S at a thickness of about 200 nm by a metal organic chemical vapor deposition (MOCVD) process.

The substrate S may further include a substrate including SiC or sapphire. The nucleation layer NUC and any subsequent nitride semiconductor layer (III-V compound semiconductor layer) are typically formed through III element plane growth (i.e., gallium plane growth or aluminum plane growth in this embodiment).

Subsequently, a superlattice structure, which includes multilayered films configured of repeatedly stacked AlN/GaN films each including a gallium nitride (GaN) layer and an aluminum nitride (AlN) layer, is formed as the strain relaxation layer SIR on the nucleation layer NUC. For example, the gallium nitride (GaN) layer having a thickness of about 20 nm and the aluminum nitride (AlN) layer having a thickness of about 5 nm are heteroepitaxially grown in an alternate manner by a metal organic chemical vapor deposition process or the like. For example, such multilayered films are formed by 40 layers.

Subsequently, for example, an AlGaN layer as the buffer layer BU is heteroepitaxially grown on the strain relaxation layer SIR at a thickness of 0.5 μm or more by a metal organic chemical vapor deposition process or the like. The AlGaN layer has an Al concentration (Al compositional ratio) of 0 to 10%, for example. In this description, A to B means A or more and B or less.

Subsequently, the channel layer CH is formed on the buffer layer BU. For example, a gallium nitride (GaN) layer is heteroepitaxially grown on the buffer layer BU by a metal organic chemical vapor deposition process or the like. The channel layer CH has a thickness of about 10 to 100 nm, for example.

Subsequently, for example, an AlGaN layer as the barrier layer BA is heteroepitaxially grown on the channel layer CH at a thickness of 5 to 20 nm by a metal organic chemical vapor deposition process or the like. The AlGaN layer has an Al concentration of 20 to 40%, for example. The AlGaN layer as the barrier layer BA has an Al concentration larger than the AlGaN layer as the buffer layer BU.

In this way, a multilayered film including the buffer layer BU, the channel layer CH, and the barrier layer BA is formed. A two-dimensional electron gas (2DEG) is generated in the vicinity of the interface between the channel layer CH and the barrier layer BA in the multilayered film.

Subsequently, as illustrated in FIG. 5, a silicon nitride film as the insulating film IF is deposited on the barrier layer BA at a thickness of, for example, about 50 to 200 nm by a CVD process or the like.

Subsequently, an undepicted photoresist film for opening element isolation regions is formed on the insulating film IF by a photolithography process. Subsequently, nitrogen ion is implanted with the photoresist film as a mask to form the undepicted element isolation regions (see FIG. 3). The ion species such as nitrogen (N) or boron (B) is thus implanted, which changes a crystal state, and increases resistance. Subsequently, the photoresist film is removed.

Figure 7:
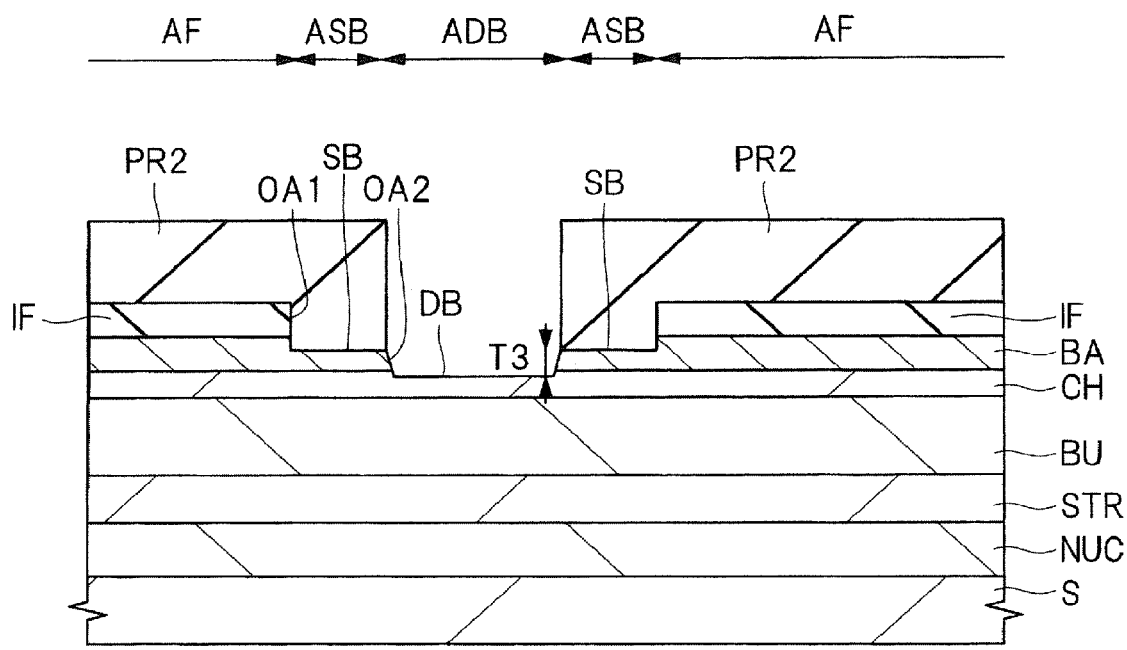
FIG. 7 is a sectional view illustrating a manufacturing step following FIG. 6 of the semiconductor device of the first embodiment.
Figure 8:
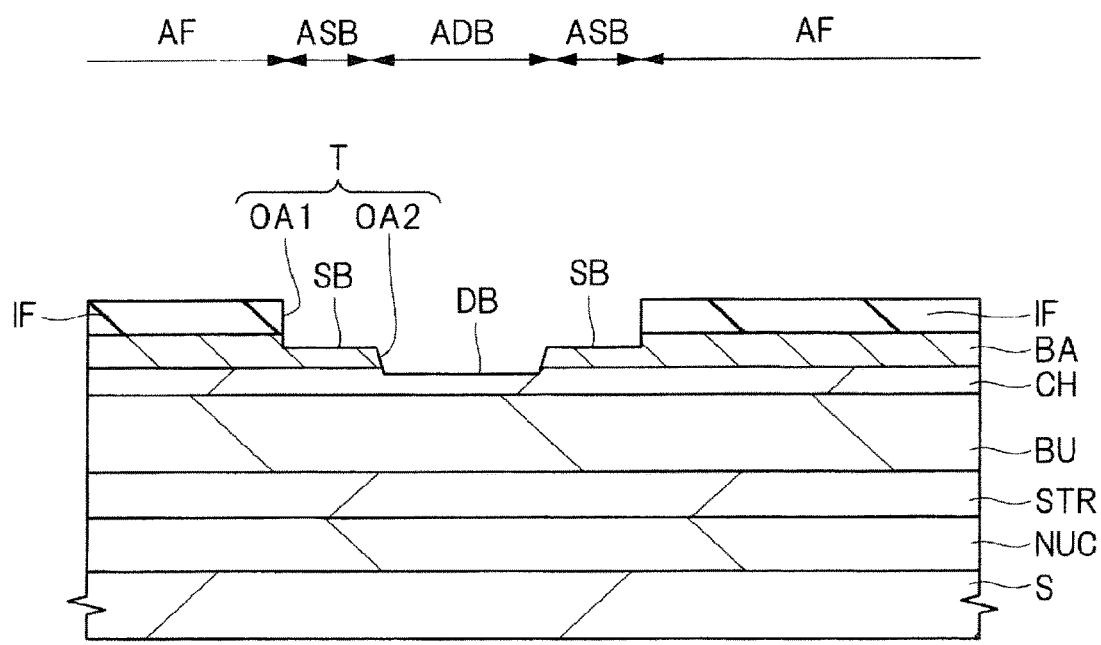
FIG. 8 is a sectional view illustrating a manufacturing step following FIG. 7 of the semiconductor device of the first embodiment.

Subsequently, as illustrated in FIGS. 6 to 8, the trench T including the opening (recess) OA1 and the opening OA2 is formed.

For example, as illustrated in FIG. 6, a photoresist film PR1 is formed on the insulating film IF, and then the photoresist film PR1 in a gate electrode formation region (the region ASB and the region ADB) is removed by a photolithography process. In other words, the photoresist film PR1 having an opening in the gate electrode formation region is formed on the insulating film IF.

Subsequently, the insulating film IF and the barrier layer BA are dry-etched with the photoresist film PR1 as a mask, thereby the opening OA1, which runs up to the middle of the barrier layer BA through the insulating film IF, is formed. When the silicon nitride film is used as the insulating film IF, for example, a dry etching gas containing fluorinated gas such as $SF_6$ is used as an etching gas. For example, a dry etching gas containing chlorinated gas such as $BCl_3$ is used as the etching gas for the barrier layer BA. The etching-removed portion of the barrier layer BA has a thickness T1. The thickness T1 corresponds to a difference in level between the bottom face of the opening OA1 and the surface of the barrier layer BA. The portion of the barrier layer BA that remains on the bottom face of the opening OA1 has a thickness T2. Subsequently, the photoresist film PR1 is removed.

Subsequently, as illustrated in FIG. 7, a photoresist film PR2 is formed on the insulating film IF and the barrier layer BA, and the photoresist film PR2 in the region ADB is removed by a photolithography process. In other words, the photoresist film PR2 having an opening in the region ADB is formed on the insulating film IF and the barrier layer BA.

Subsequently, the barrier layer BA and the channel layer CH are dry-etched with the photoresist film PR2 as a mask, thereby the opening OA2, which runs up to the middle of the channel layer CH through the insulating film IF and the barrier layer BA, is formed. For example, a dry etching gas containing chlorinated gas such as $BCl_3$ is used as the etching gas. The etching-removed portions of the barrier layer BA and the channel layer CH have a total thickness T3. The thickness T3 corresponds to a difference in level between the bottom face of the opening OA1 and the bottom face of the opening OA2. Subsequently, the photoresist film PR2 is removed.

Consequently, as illustrated in FIG. 8, the trench T having the shallow bottom portions SB and the deep bottom portion DB is formed. Each shallow bottom portion SB corresponds to the bottom face of the opening OA1, and the deep bottom portion DB corresponds to the bottom face of the opening OA2. As described above, the opening OA1 is formed so as to enclose the opening OA2 (see FIG. 2). For example, the shallow bottom portion SB has a width of about 0.2 to 5 μm.

Figure 9:
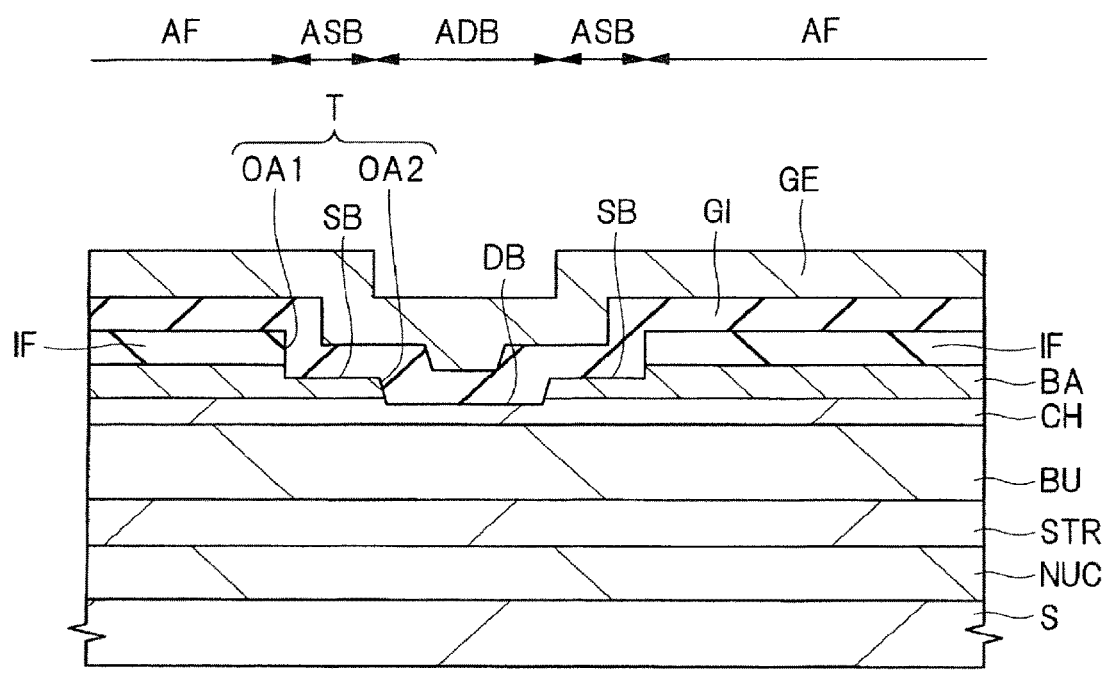
FIG. 9 is a sectional view illustrating a manufacturing step following FIG. 8 of the semiconductor device of the first embodiment.
Figure 10:
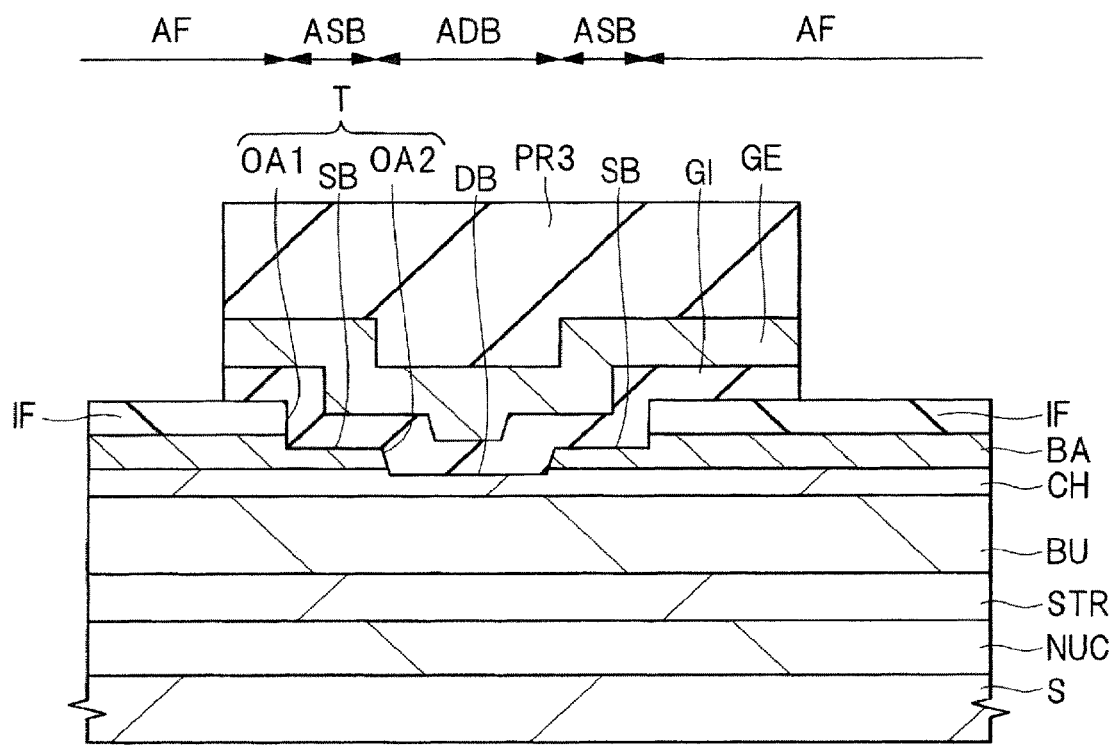
FIG. 10 is a sectional view illustrating a manufacturing step following FIG. 9 of the semiconductor device of the first embodiment.

Subsequently, as illustrated in FIGS. 9 and 10, the gate electrode GE is formed over the insulating film IF and over the inside of the trench T with the gate insulating film GI in between. For example, as illustrated in FIG. 9, an aluminum oxide film as the gate insulating film GI is deposited at a thickness of about 50 nm over the insulating film IF and over the inside of the trench T by an atomic layer deposition (ALD) process.

The gate insulating film GI may further include a silicon oxide film and a high-dielectric-constant film having a dielectric constant higher than the silicon oxide film. The high-dielectric-constant film includes a silicon nitride (SiN) film, and hafnium-based insulating films such as a hafnium oxide ($HfO_2$) film, a hafnium aluminate film, a hafnium oxynitride (HfON) film, a hafnium silicate (HfSiO) film, a hafnium silicon oxynitride (HfSiON) film, and a HfAlO film.

Subsequently, for example, a titanium nitride (TiN) film as a conductive film configuring the gate electrode GE is formed on the gate insulating film GI at a thickness of about 200 nm by a sputtering process or the like. Subsequently, as illustrated in FIG. 10, a photoresist film PR3 is formed in the gate electrode formation region by a photolithography technique, and the TiN film is etched with the photoresist film PR3 as a mask, so that the gate electrode GE is formed. The gate insulating film GI under the TiN film may be etched during the etching. For example, the TiN film is processed through dry etching using a dry etching gas containing a chlorinated gas such as $Cl_2$, and the aluminum oxide film is processed through dry etching using a dry etching gas containing a chlorinated gas such as $BCl_3$.

The gate electrode GE is patterned by the etching so as to overhang in one direction (rightward or toward the drain electrode DE in FIG. 10). Such an overhanging portion is referred to as field plate electrode section. The field plate electrode section corresponds to a partial region of the gate electrode GE extending toward the drain electrode DE from an end of the trench T on a side close to the drain electrode DE. Subsequently, the photoresist film PR3 is removed.

Figure 11:
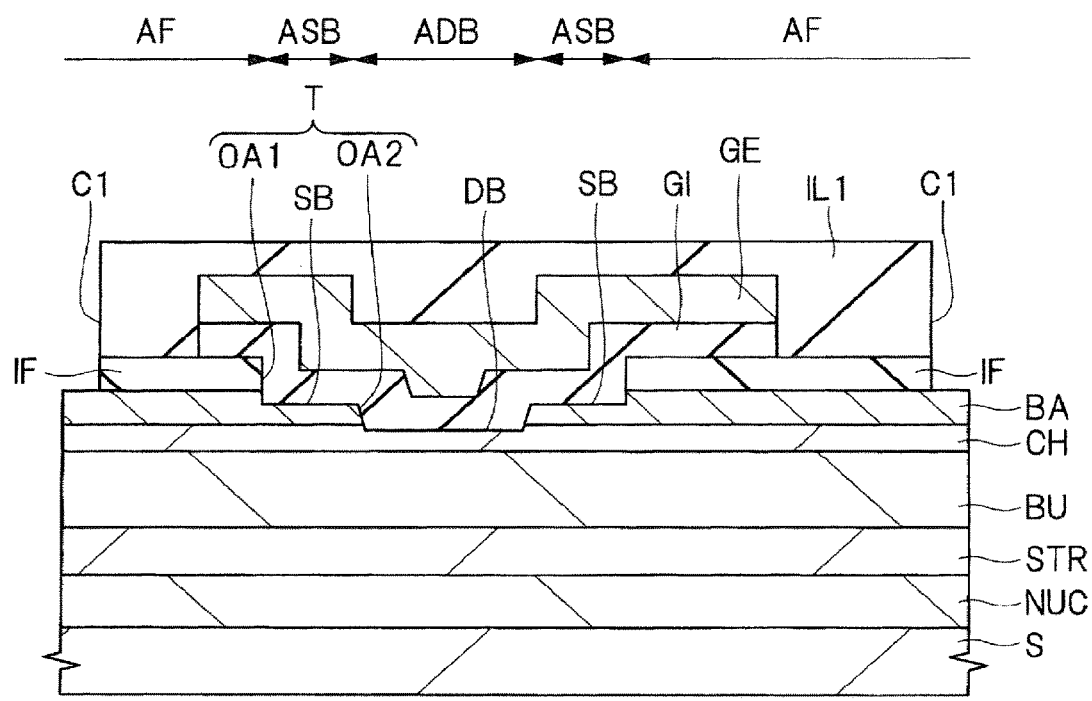
FIG. 11 is a sectional view illustrating a manufacturing step following FIG. 10 of the semiconductor device of the first embodiment.

Subsequently, as illustrated in FIG. 11, for example, a silicon oxide film as the interlayer insulating film IL1 is deposited at about 2000 nm over the insulating film IF and over the gate electrode GE by a CVD process or the like. Subsequently, the contact holes C1 are formed through the interlayer insulating film IL1 and the insulating film IF by a photolithography technique and an etching technique. The respective contact holes C1 are formed in the source electrode formation region and the drain electrode formation region. For example, an undepicted photoresist film having an opening in each of the source electrode formation region and the drain electrode formation region is formed on the interlayer insulating film IL1. Subsequently, the interlayer insulating film IL1 and the insulating film IF are etched with the photoresist film as a mask, thereby the contact holes C1 are formed. Subsequently, the photoresist film is removed. The barrier layer BA is exposed from the bottom face of each contact hole C1 formed through such a step.

Figure 12:
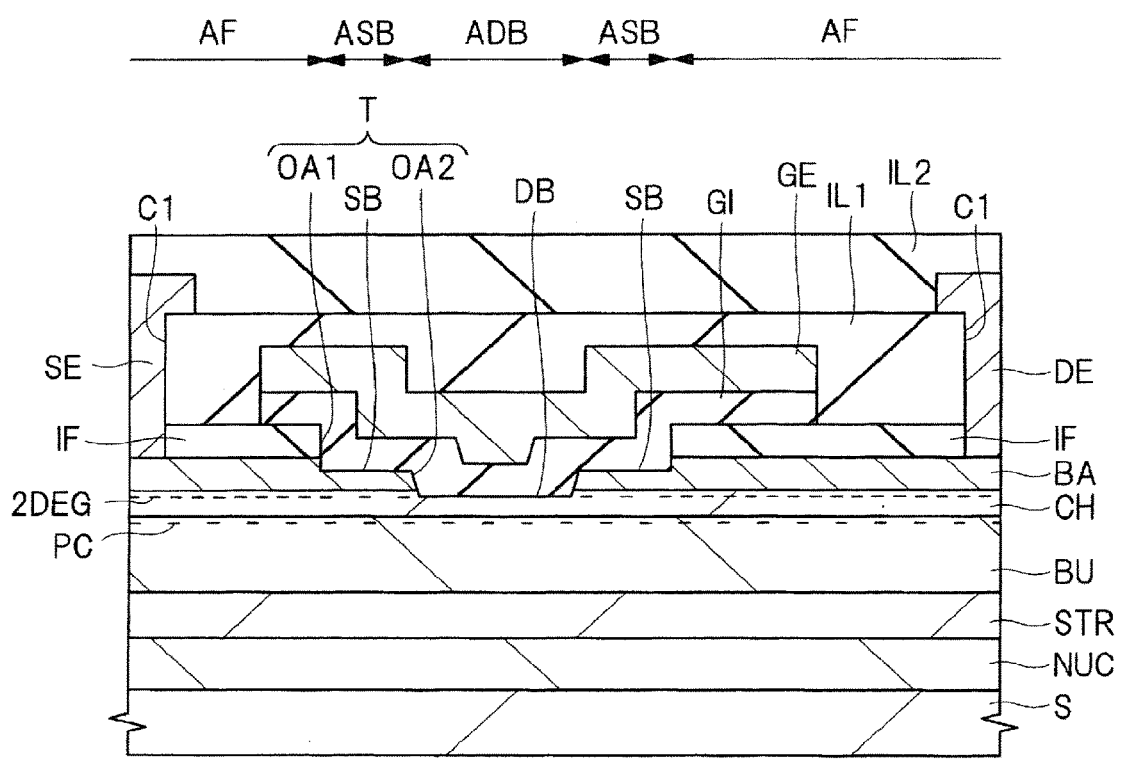
FIG. 12 is a sectional view illustrating a manufacturing step following FIG. 11 of the semiconductor device of the first embodiment.

Subsequently, as illustrated in FIG. 12, the source electrode SE and the drain electrode DE are formed on the barrier layer BA on either side of the gate electrode GE. For example, a conductive film is formed over the interlayer insulating film IL1 and over the inside of each contact hole C1. For example, a multilayered film (Al/TiN) including a titanium nitride (TiN) film and an upper-layer aluminum (Al) film is formed as the conductive film by a sputtering process or the like. The titanium nitride film has a thickness of, for example, about 50 nm. The aluminum film has a thickness of, for example, about 1000 nm.

Subsequently, an undepicted photoresist film is formed in a formation region of each of the source electrode SE and the drain electrode DE by a photolithography technique, and the conductive film (Al/TiN) is etched with the photoresist film as a mask. The source electrode SE and the drain electrode DE are formed through such a step.

Subsequently, for example, a silicon oxide film as the interlayer insulating film IL2 is deposited by a CVD process or the like over the interlayer insulating film IL1, the source electrode SE, and the drain electrode DE. In the subsequent steps, while not illustrated, for example, plugs (PG) and interconnections (such as source lines SL and drain lines DL) are formed, and a protective film (an insulating film, a cover film, or a surface protective film) is formed on the top interconnection.

The semiconductor device of the first embodiment can be formed through the above-described steps. Such steps are merely an example, and the semiconductor device of the first embodiment may be manufactured through other steps. For example, either of the opening OA1 and the opening OA2 may be formed first. The etching step may be performed with dry etching or wet etching.

The semiconductor device of the first embodiment is configured such that the thin barrier layer BA remains in the shallow bottom portion SB on either side of the deep bottom portion DB, which prevents a decrease in threshold potential, and improves the normally-off operability.

Figure 13:
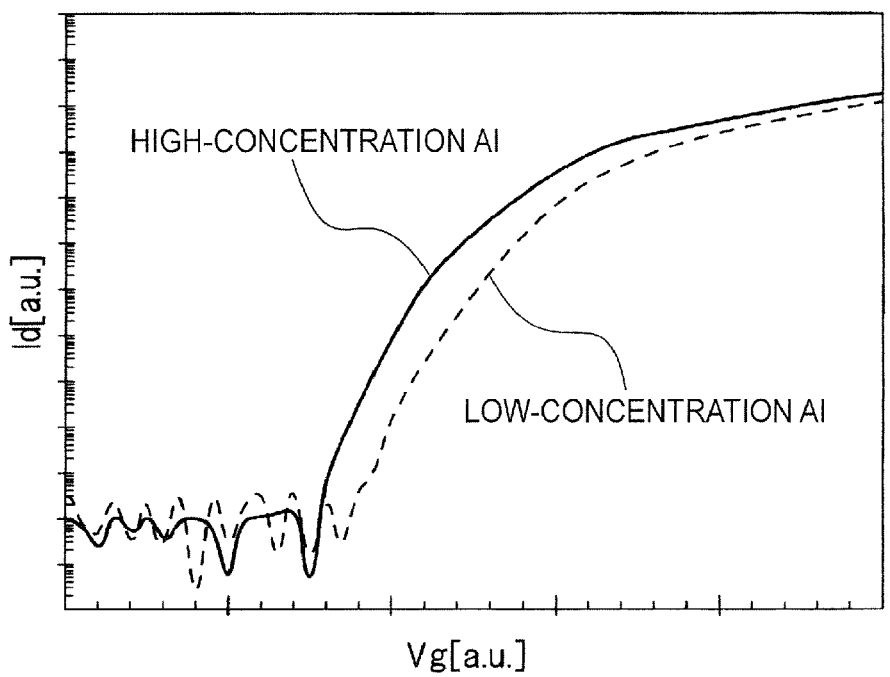
FIG. 13 is a graph illustrating a relationship between Al concentration of a barrier layer and threshold voltage.
Figure 14:
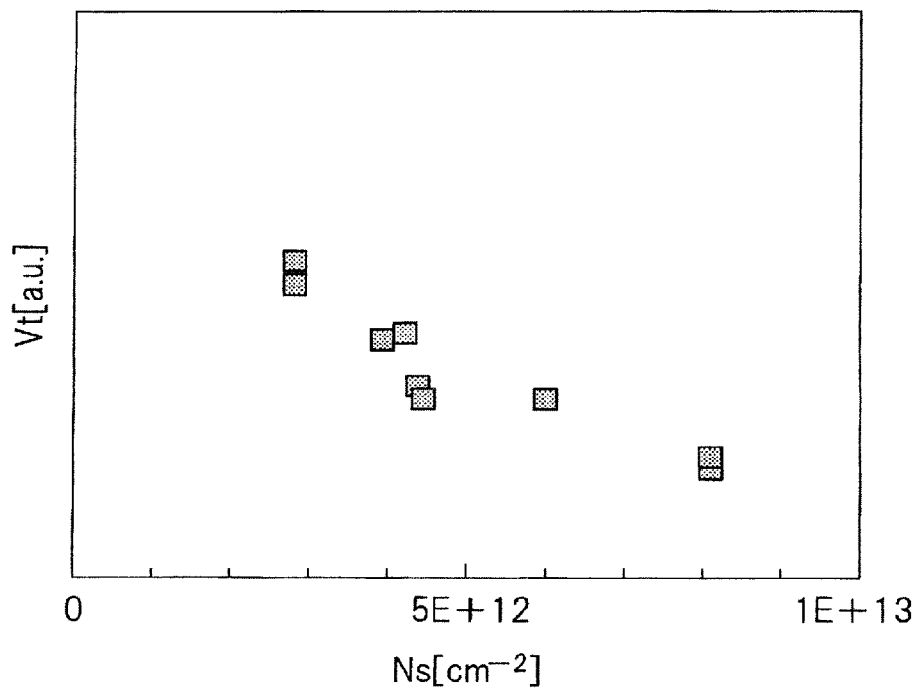
FIG. 14 is a graph illustrating a relationship between $N_s$ and the threshold voltage.

Through investigations, the inventors have found that if the Al concentration of the barrier layer is increased from 22% to 30% to decrease the ON resistance in a semiconductor device of a comparative example (see FIG. 16 described later), in which the barrier layer is not thinned in the formation region (region ASB) of the shallow bottom portion SB, the threshold voltage is lowered. FIG. 13 is a graph illustrating a relationship between the Al concentration of the barrier layer and the threshold voltage. Examination has been made on the I-V characteristics of semiconductor devices of comparative examples, between which a difference in Al concentration of the barrier layer is 10%. In the graph, the horizontal axis is gate voltage Vg [a. u.], and the vertical axis is drain current Id [a. u.]. FIG. 14 is a graph illustrating a relationship between sheet carrier density ($N_s$) and the threshold voltage. As described later, $N_s$ can be adjusted by adjusting a difference in Al concentration between the buffer layer (AlGaN) and the barrier layer (AlGaN), and by adjusting the thickness of the barrier layer (AlGaN). In the graph, the horizontal axis is $N_s$ [$cm^{-2}$], and the vertical axis is threshold voltage Vt [a. u.].

As illustrated in FIG. 13, in comparison of the devices having a difference in Al concentration of the barrier layer of 10%, a higher Al concentration results in a lower threshold voltage. Furthermore, as illustrated in FIG. 14, the threshold voltage is lowered along with an increase in $N_s$.

Figure 15:
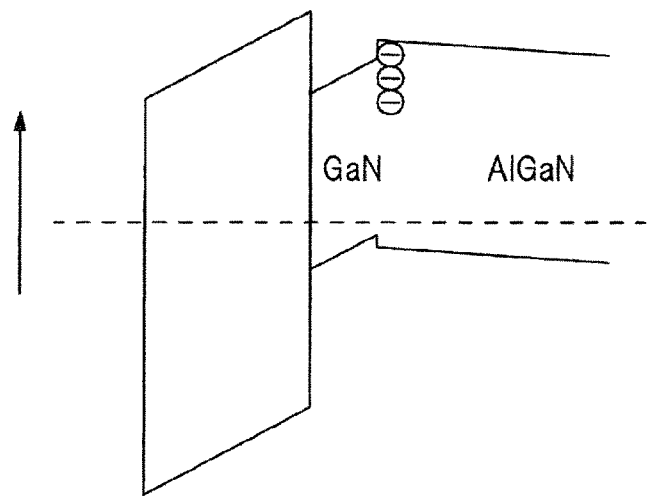
FIG. 15 is a band diagram in the vicinity of a formation region of a channel.
Figure 16:
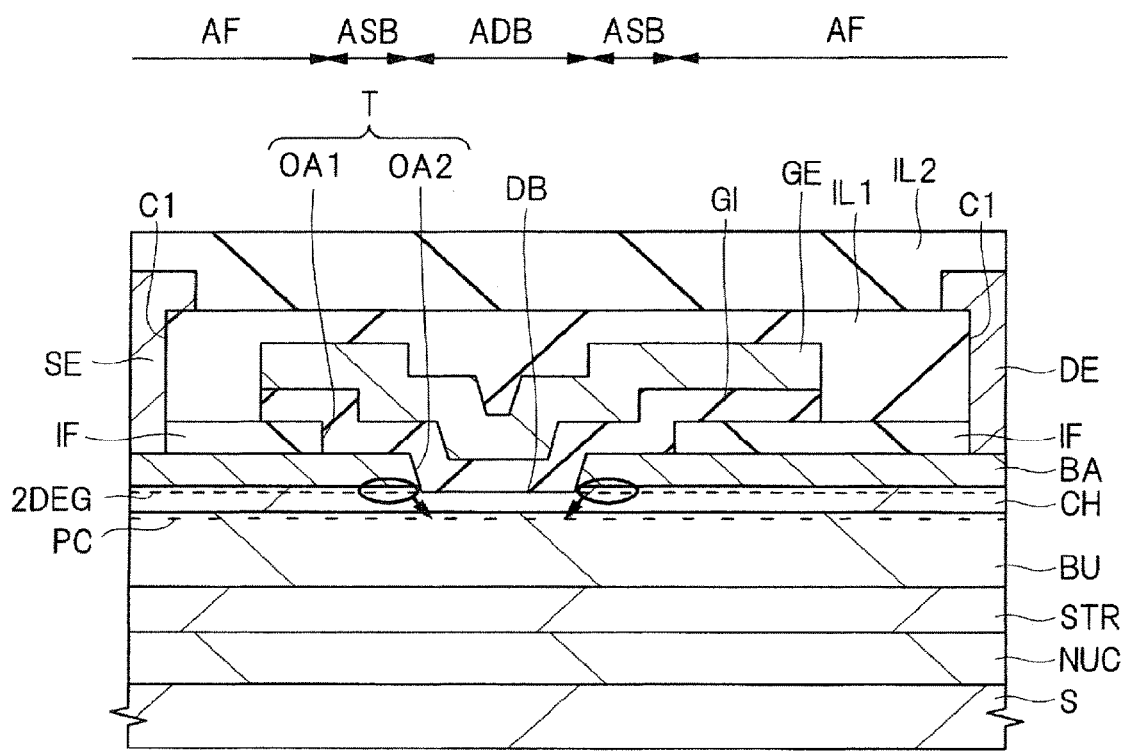
FIG. 16 is a schematic view illustrating a decrease in threshold voltage in the case of using a barrier layer having a high Al concentration.

This is probably because the concentration of the two-dimensional electron gas increases due to the increase in Al concentration of the barrier layer, which reduces the effect of the polarization charge below the channel. FIG. 15 is a band diagram in the vicinity of a channel formation region. FIG. 16 is a schematic view illustrating a decrease in the threshold voltage in the case of using the barrier layer having a high Al concentration.

For example, as illustrated in FIG. 15, polarization charge is generated in the buffer layer in the vicinity of the interface between the channel layer (GaN) and the buffer layer (AlGaN) below the gate insulating film ($Al_2O_3$) in which the channel is induced. The polarization charge raises the conduction band, and thus allows the threshold potential to rise to a positive side.

However, as illustrated in FIG. 16, if the barrier layer having a high Al concentration is used to increase the concentration of the two-dimensional electron gas 2DEG in the semiconductor device of the comparative example, in which the barrier layer is not thinned in the formation region (region ASB) of the shallow bottom portion SB, relative concentration (density) of the polarization charge PC is decreased, and thus the effect of the polarization charge PC is reduced. Hence, the threshold voltage is provably lowered.

In contrast, in the first embodiment, since only the thin barrier layer BA is provided in the shallow bottom portion SB, the concentration of the two-dimensional electron gas 2DEG can be decreased in the shallow bottom portion SB (see FIG. 1).

In other words, since the thickness of the barrier layer BA in the shallow bottom portion SB (region ASB) is thinner than that of the barrier layer BA in the region (region AF) having no trench T, the concentration of the two-dimensional electron gas 2DEG is lower in the shallow bottom portion SB (region ASB) than in the region (region AF) having no trench T. This reduces influence of the two-dimensional electron gas 2DEG on the polarization charge PC in the shallow bottom portion SB.

Figure 17:
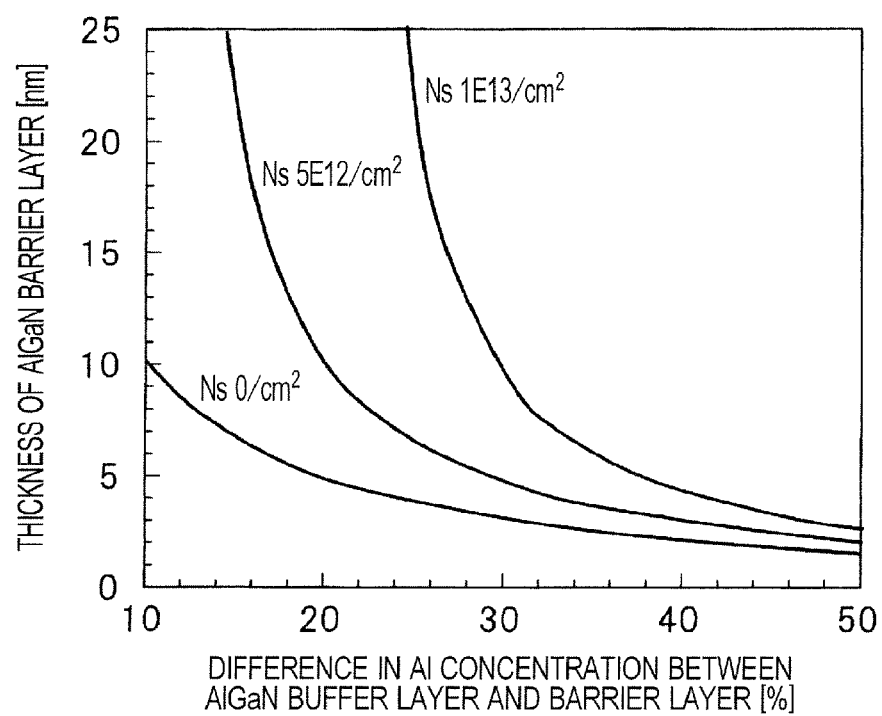
FIG. 17 is a graph illustrating a relationship between a difference in Al concentration between a buffer layer and the barrier layer, and a thickness of the barrier layer.

FIG. 17 is a graph illustrating a relationship between a difference in Al concentration between the buffer layer and the barrier layer, and a thickness of the barrier layer. In the graph, the horizontal axis is a difference in Al concentration [%] between the buffer layer (AlGaN) and the barrier layer (AlGaN), and the vertical axis is thickness [nm] of the barrier layer (AlGaN). A relationship of a difference in Al concentration between the buffer layer (AlGaN) and the barrier layer (AlGaN) with a thickness of the barrier layer (AlGaN) is examined for each of $N_s$ [$cm^{-2}$] values of $1E13/cm^2$, $5E12/cm^2$, and $0/cm^2$.

The thickness of the barrier layer BA in the shallow bottom portion SB (region ASB) is preferably selected depending on $N_s$ to be designed such that the thickness corresponds to a concentration that does not reduce the effect of the polarization charge by the buffer layer. For example, when $N_s$ in the shallow bottom portion SB (region ASB) is intentionally set within a range from to $5E12/cm^2$, a combination of a difference in Al concentration between the buffer layer (AlGaN) and the barrier layer (AlGaN) and a thickness of the barrier layer (AlGaN) should be appropriately selected based on FIG. 17.

The barrier layer preferably has a thickness of 2 nm or more. The width of the shallow bottom portion SB (region ASB) of 0.2 μm or more prevents the effect of the polarization charge from being reduced. The combination is preferably selected such that $N_s$ is $5E12/cm^2$ or more in the region (region AF) having no trench T. For example, a difference in Al concentration between the buffer layer (AlGaN) and the barrier layer (AlGaN) and a thickness of the barrier layer (AlGaN) are appropriately set based on FIG. 17 such that desired $N_s$ is obtained, thereby the ON resistance can be decreased.

In this way, the provision of the shallow bottom portion SB allows individual adjustment of the concentration of the two-dimensional electron gas 2DEG between the shallow bottom portion SB and the region (region AF) having no trench T. This achieves high concentration of the two-dimensional electron gas 2DEG in the region (region AF) having no trench T, and thus the ON resistance is decreased.

For example, when the barrier layer (AlGaN) having an Al concentration of 25% and a thickness of about 6 nm exists in the shallow bottom. portion SB (region ASB), the concentration of the two-dimensional electron gas 2DEG is about $2E12/cm^2$ that does not cause a decrease in threshold voltage. When the barrier layer (AlGaN) having an Al concentration of 25% and a thickness of about 17 nm exists in the region having no trench T (region with the barrier layer BA being unetched), the concentration of the two-dimensional electron gas 2DEG is about $7E12/cm^2$, and thus access resistance is sufficiently decreased between the drain and the gate, and between the source and the gate.

(Application 1)

Although the buffer layer is not intentionally doped with an impurity in the semiconductor device illustrated in FIG. 1, the buffer layer may contain a p-type impurity, for example.

Figure 18:
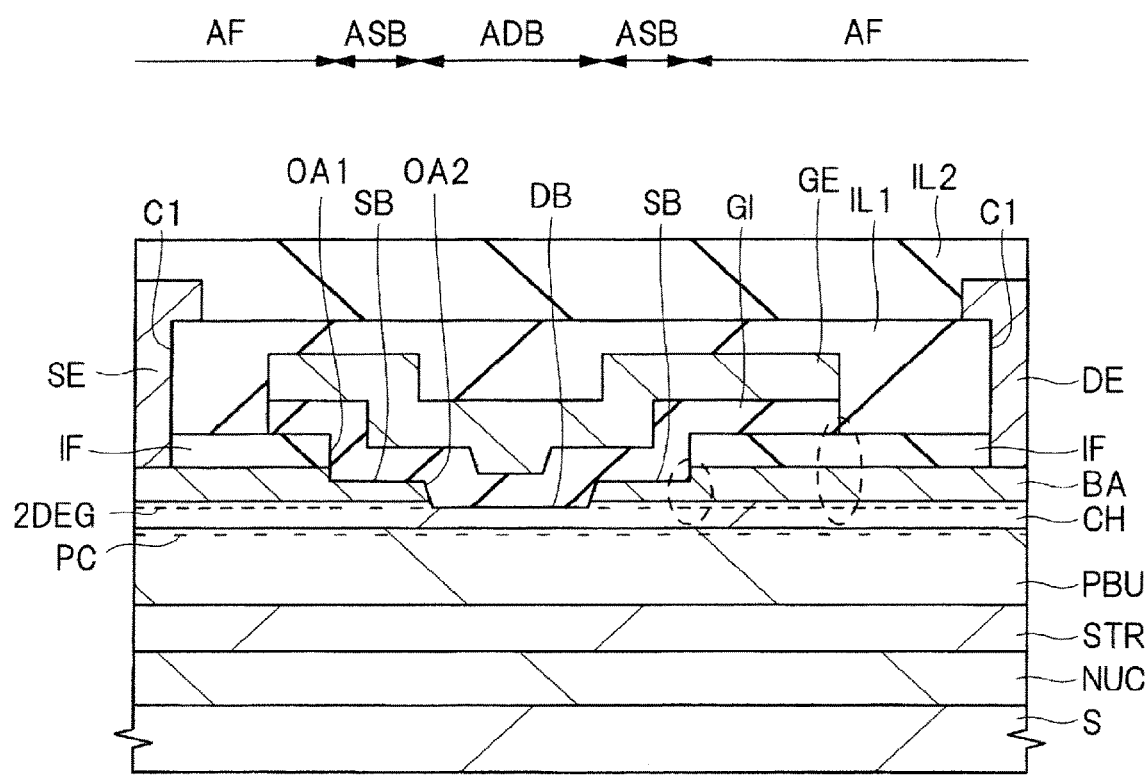
FIG. 18 is a sectional view illustrating a configuration of a semiconductor device of application 1 of the first embodiment.

FIG. 18 is a sectional view illustrating a configuration of a semiconductor device of application of the first embodiment. Since the semiconductor device is similar to the semiconductor device of FIG. 1 except for the configuration of a buffer layer PBU, like configurations and like manufacturing steps thereof will not be described.

In the semiconductor device of the application 1, for example, a p-type AlGaN layer is used as the buffer layer BU. For example, Mg is used as the p-type impurity. Such a buffer layer PBU can be formed by a metal organic chemical vapor deposition process as in the first embodiment.

When the p-type AlGaN is thus used for the buffer layer PBU, the concentration of the two-dimensional electron gas 2DEG in the formation region of the shallow bottom portion SB is controlled to be lower than the concentration of the two-dimensional electron gas 2DEG in the region (region AF) having no trench T, thereby the effect of raising the threshold voltage is also provided.

(Application 2)

Although the semiconductor device illustrated in FIG. 1 includes the buffer layer, the buffer layer may not be provided.

Since the semiconductor device of the application 2 of the first embodiment is similar to the semiconductor device of FIG. 1 except that the buffer layer BU is not provided, like configurations and like manufacturing steps thereof will not be described.

In the semiconductor device of the application 2, the buffer layer BU is not provided, and, for example, the channel layer CH is formed on the strain relaxation layer SIR.

FIG. 19A includes a sectional view of a semiconductor device of a comparative example, and a band diagram in a lower recess portion (B-B' portion) of the semiconductor device, showing an energy level of a conduction band. FIG. 19B includes a sectional view of the semiconductor device of the application 2, and a band diagram in a lower recess portion (B-B' portion) of the semiconductor device.

As illustrated in FIG. 19A, the semiconductor device (a) of the comparative example does not have the shallow bottom portion SB, i.e., have the barrier layer that is not thinned in the formation region of the shallow bottom portion SB. In contrast, as illustrated in FIG. 19B, although the semiconductor device (b) of the application 2 does not have the buffer layer, a decrease in channel potential can be suppressed by decreasing the concentration of the two-dimensional electron gas 2DEG in a region adjacent to the trench portion. This prevents a decrease in threshold potential, and thus improves normally-off operability.

Second Embodiment

In a second embodiment, the barrier layer is configured of two layers having different Al concentrations. Since the semiconductor device of the second embodiment is similar to the semiconductor device of the first embodiment except for the configuration of the barrier layer, corresponding configurations and corresponding manufacturing steps thereof will not be described in detail.

A semiconductor device of the second embodiment is now described in detail with reference to the accompanying drawings.

Structural Explanation

Figure 20:
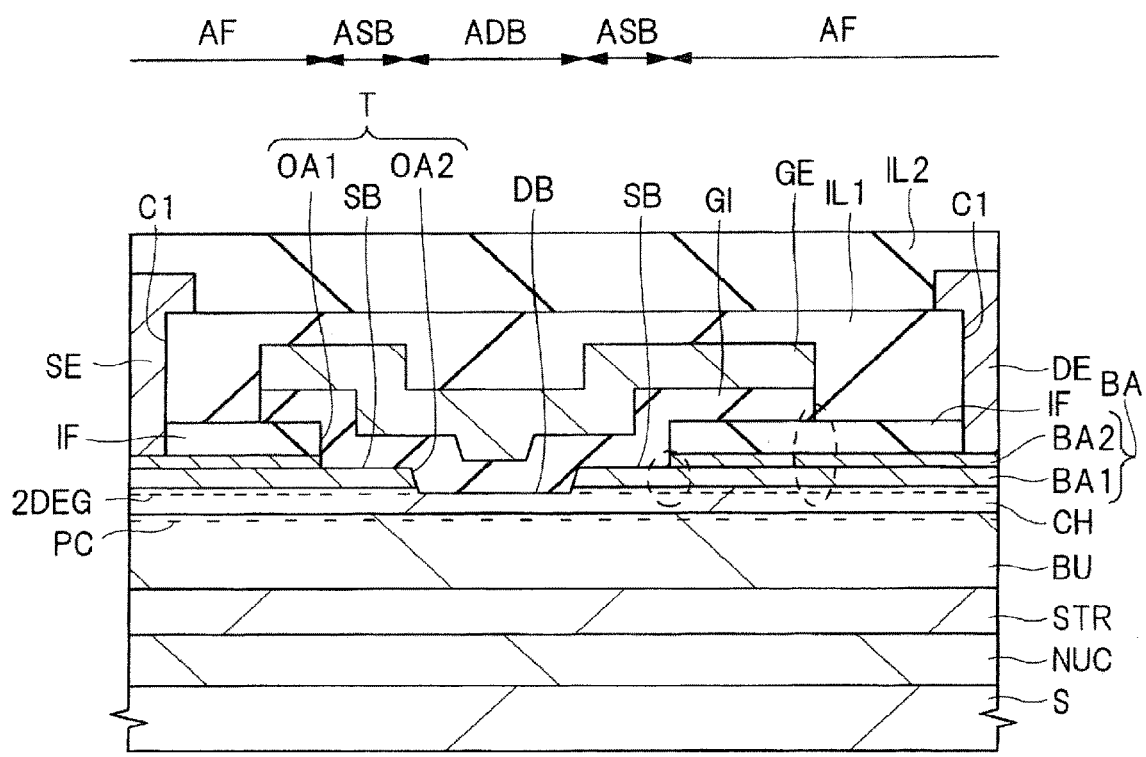
FIG. 20 is a sectional view illustrating a configuration of a semiconductor device of a second embodiment.

FIG. 20 is a sectional view illustrating a configuration of the semiconductor device of the second embodiment. The semiconductor device (semiconductor element) of the second embodiment illustrated in FIG. 20 is a MIS field effect transistor including nitride semiconductor. The semiconductor device can be used as a high-electron-mobility transistor type of power transistor. The semiconductor device of the second embodiment is a so-called recessed-gate semiconductor device.

As with the first embodiment (FIG. 1), the semiconductor device of the second embodiment has the nucleation layer NUC, the strain relaxation layer STR, the buffer layer BU, the channel layer CH, and the barrier layer BA provided in this order on the substrate S. The insulating film IF is provided on the barrier layer BA.

In the second embodiment, the barrier layer BA is configured of two layers of a low-Al barrier layer BA1 located on a side close to the channel layer CH and a high-Al barrier layer BA2 located on a side close to the insulating film IF. The low-Al barrier layer BA1 has an Al concentration (Al compositional ratio) lower than the high-Al barrier layer BA2.

The gate electrode GE is provided within the trench T including the opening OA1 and the opening OA2 and on the insulating film IF with the gate insulating film GI in between. The trench T has shallow bottom portions SB and a deep bottom portion DB. Each shallow bottom portion SB is provided on either side of the deep bottom portion DB. A shallow bottom portion SB may be provided so as to enclose the deep bottom portion DB (see FIG. 2).

Figure 23:
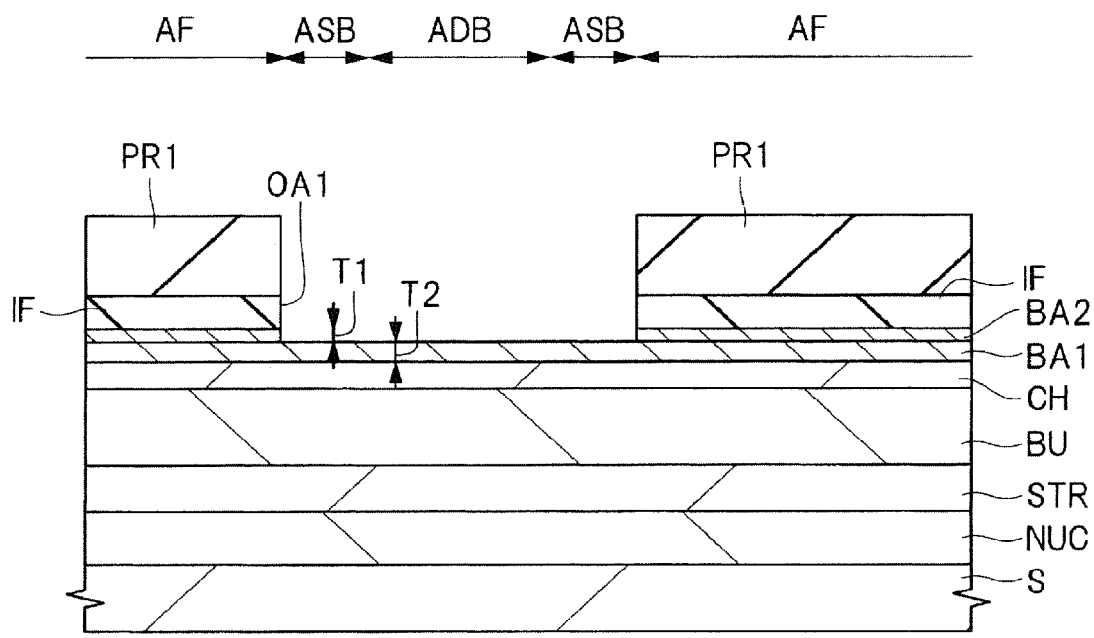
FIG. 23 is a sectional view illustrating a manufacturing step following FIG. 22 of the semiconductor device of the second embodiment.

The opening OA1 runs up to the bottom face of the high-Al barrier layer BA2 (i.e., the surface of the low-Al barrier layer BA1) through the insulating film IF (see FIG. 23). The bottom face of the opening OA1 corresponds to the shallow bottom portion SB. The surface of the low-Al barrier layer BA1 is exposed from the shallow bottom portion SB. In other words, the low-Al barrier layer BA1 remains under the shallow bottom portion SB.

Figure 24:
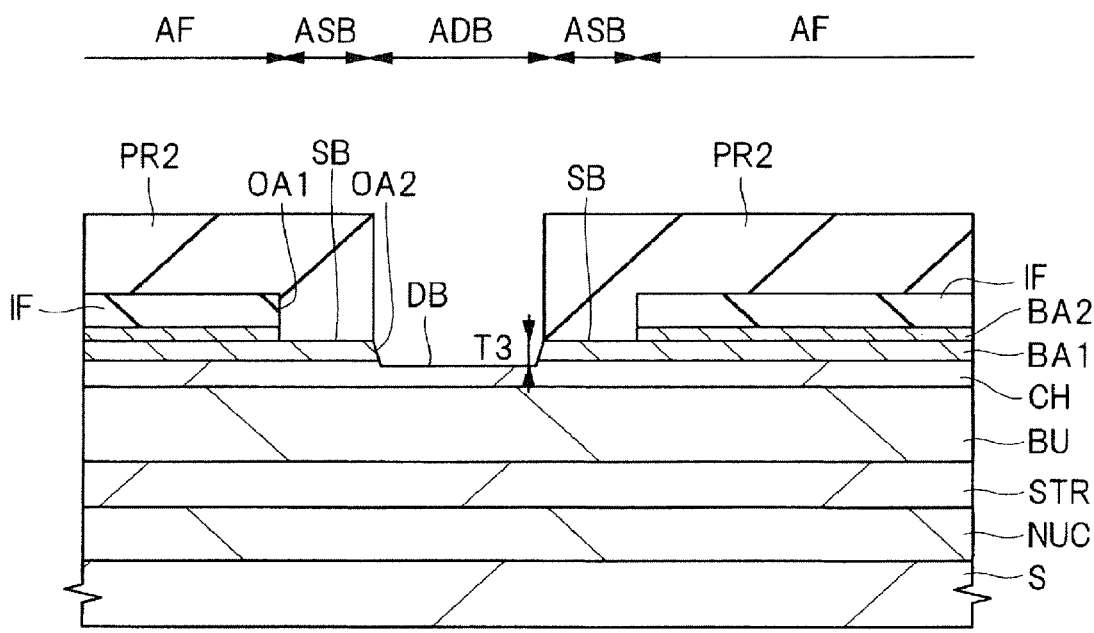
FIG. 24 is a sectional view illustrating a manufacturing step following FIG. 23 of the semiconductor device of the second embodiment.

The opening OA2 runs up to the middle of the channel layer CH through the insulating film IF and the barrier layer BA (the low-Al barrier layer BA1 and the high-Al barrier layer BA2) (see FIG. 24). The bottom face of the opening OA2 corresponds to the deep bottom portion DB. The deep bottom portion DB is located within the channel layer CH. In other words, the channel layer CH is exposed from the deep bottom portion DB. The formation region of the shallow bottom portion SB is referred to as region ASB. The formation region of the deep bottom. portion DB is referred to as region ADB. A region having no trench T (region with the barrier layer BA being unetched) is referred to as region AF.

In the second embodiment, the two-dimensional electron gas 2DEG generated in the vicinity of the interface between the channel layer CH and the barrier layer BA is also separated by the opening OA2 having the gate electrode GE therein. Hence, the semiconductor device of the second embodiment maintains OFF during application of no positive potential (threshold potential) to the gate electrode GE, and maintains ON during application of the positive potential (threshold potential) to the gate electrode GE. In this way, the semiconductor device performs normally-off operation.

The buffer layer BU is thus provided under the channel layer CH, thereby polarization charge (negative fixed charge) PC is generated in the buffer layer BU in the vicinity of the interface between the channel layer CH and the buffer layer BU. The polarization charge PC raises the conduction band, and thus allows the threshold potential to rise to a positive side (see FIG. 15). This improves normally-off operability.

The source electrode SE is provided on the barrier layer BA on one side (on the left side in FIG. 20) of the gate electrode GE. The drain electrode DE is provided on the barrier layer BA on the other side (on the right side in FIG. 20) of the gate electrode GE. The source electrode SE and the drain electrode DE are each disposed in and on the contact hole C1 provided in the interlayer insulating film IL1. The source electrode SE and the drain electrode DE are covered with the interlayer insulating film IL2.

The semiconductor device of the second embodiment is also configured such that the low-Al barrier layer BA1 remains in the shallow bottom portion SB on either side of the deep bottom portion DB, which decreases the concentration of the two-dimensional electron gas 2DEG below the shallow bottom portion SB as described in detail in the first embodiment. The concentration of the two-dimensional electron gas 2DEG below the shallow bottom portion SB is thus decreased, thereby the conduction band-raising effect of the polarization charge PC is prevented from being reduced. This prevents a decrease in the threshold potential, and thus improves normally-off operability.

The provision of the shallow bottom portion SB allows individual adjustment of the concentration of the two-dimensional electron gas 2DEG between the shallow bottom portion SB and the region (region AF) having no trench T. Specifically, since the high-Al barrier layer BA2 exists on either side of the trench (shallow bottom portion SB) T, the concentration of the two-dimensional electron gas 2DEG can be increased. This allows the ON resistance to be reduced.

When the threshold potential is applied to the gate electrode GE in the shallow bottom portion SB, a channel is induced therein. This allows the ON resistance to be reduced.

The provision of the shallow bottom portion SB divides into two the electric-field concentration portion below the gate electrode GE (see round portions enclosed by broken lines in FIG. 1). This relaxes electric-field concentration, and thus increases the gate breakdown voltage.

Furthermore, in the second embodiment, since the barrier layer BA has a double-layered structure, the Al concentration can be adjusted for each layer, leading to an increase in processing margin.

FIG. 21 is a graph illustrating a relationship between the Al concentration of the barrier layer and $N_s$. $N_s$ is examined for the Al concentration of the barrier layer (AlGaN) of 15 to 40%. AlGaN having an Al concentration of 5% is used for the buffer layer. In the graph, the horizontal axis is thickness [nm] of the AlGaN buffer layer, and the vertical axis is $N_s$ [cm$^{-2}$]. Furthermore, 1.5E+13 indicates $1.5 \times 10^{13}$.

As illustrated in FIG. 21, $N_s$ sensitivity for thickness is extremely high in a thin-film region having a high Al concentration. Specifically, for a barrier layer (AlGaN) having an Al concentration of 40%, $N_s$ abruptly increases in a thickness range from 0 to 10 nm. Hence, the barrier layer BA has a multilayer structure with the low-Al barrier layer BA1, thereby the total thickness of the barrier layer BA can be increased. This ensures a large processing margin for formation of the trench T.

For example, when the high-Al barrier layer BA2 is singly used as the barrier layer BA, the high-Al barrier layer BA2 must be left as thin as possible to decrease the two-dimensional electron gas 2DEG in the shallow bottom portion SB. For example, when an AlGaN layer having an Al concentration of 30% is singly used as the barrier layer BA, the AlGaN layer must be etched into a thickness of about 6 nm in the shallow bottom portion SB. This requires high-precision etching control. Furthermore, as described with reference to FIG. 21, since $N_s$ sensitivity is extremely high in the thin-film region having a high Al concentration, variations in thickness greatly affect the concentration of the two-dimensional electron gas 2DEG. It is therefore necessary to perform high-precision etching control for a thin residual film and uniform etching.

In contrast, the second embodiment is designed such that the barrier layer BA has the multilayer structure, and the lower layer is configured of the low-Al barrier layer BA1. This makes it possible to increase the thickness of the low-Al barrier layer BA1 that is left in the shallow bottom portion SB, and decrease variations in concentration of the two-dimensional electron gas 2DEG caused by variations in thickness.

A planar layout of each portion of the semiconductor device of the second embodiment may be similar to that in the first embodiment (see FIGS. 2 and 3), for example.

The material for each portion of the semiconductor device of the second embodiment may be similar to that in the first embodiment. For example, an AlGaN layer is used as the barrier layer BA (the low-Al barrier layer BA1 and the high-Al barrier layer BA2) of the semiconductor device of the second embodiment. For example, the high-Al barrier layer BA2 has an Al concentration of 25 to 50% and a thickness of about 2 to 20 nm. The low-Al barrier layer BA1 may have an Al concentration of 10 to 25% and a thickness of about 5 to 50 nm. The upper limit of the thickness of each layer is determined as critical thickness in light of point defect generation and the like. When an AlGaN layer having an Al concentration of 15% and a thickness of 22 nm is used as the low-Al barrier layer BA1, the two-dimensional electron gas 2DEG has a concentration of about $2.5E12/cm^2$. For example, such a concentration of the two-dimensional electron gas 2DEG does not cause a decrease in threshold voltage in the semiconductor device of the second embodiment. In the region having no trench T (region with the barrier layer BA being unetched), the concentration of the two-dimensional electron gas 2DEG generated by the barrier layer BA1 and the barrier layer BA2 is about $1E13/cm^2$ due to the high-Al barrier layer BA2 (Al concentration 40%, thickness 9 nm), and thus access resistance is sufficiently decreased between the drain and the gate, and between the source and the gate. When a multilayered film of the low-Al barrier layer BA1 and the high-Al barrier layer BA2 is used as the barrier layer BA, the Al concentrations (x, y, z) of the buffer layer BU (represented as $Al_xGa_{1-x}N$), the barrier layer BA1 (represented as $Al_yGa_{1-y}N$), and the barrier layer BA2 (represented as $Al_zGa_{1-z}N$) have a relationship of $x<y<z$.

InAlN can also be used as the material for the barrier layer BA. In the case of using the InAlN layer, the multilayered film of the low-Al barrier layer BA1 and the high-Al barrier layer BA2 should also be used as the barrier layer BA.

Description of Manufacturing Method

Subsequently, a method of manufacturing the semiconductor device of the second embodiment is described with reference to FIGS. 22 to 28, while the configuration of the semiconductor device is further clarified. FIGS. 22 to 28 are each a sectional view illustrating a manufacturing step of the semiconductor device of the second embodiment.

As illustrated in FIG. 22, the nucleation layer NUC, the strain relaxation layer STR, the buffer layer BU, the channel layer CH, the barrier layers BA1 and BA2, and the insulating film IF are sequentially formed on the substrate S. The nucleation layer NUC, the strain relaxation layer SIR, the buffer layer BU, and the channel layer CH can each be formed using the same material and in the same way as in the first embodiment. Subsequently, the barrier layer BA including the low-Al barrier layer BA1 and the high-Al barrier layer BA2 is formed on the channel layer CH. For example, an AlGaN layer as the low-Al barrier layer BA1 is heteroepitaxially grown on the channel layer CH at an Al concentration of 10 to 25% and a thickness of 5 to 50 nm by a metal organic chemical vapor deposition process or the like. Subsequently, an AlGaN layer as the high-Al barrier layer BA2 is heteroepitaxially grown on the low-Al barrier layer BA1 at an Al concentration of 25 to 50% and a thickness of 2 to 20 nm by a metal organic chemical vapor deposition process or the like. The Al concentration can be adjusted by varying a flow rate of an Al source gas used in the metal organic chemical vapor deposition process. Subsequently, as in the first embodiment, a silicon nitride film as the insulating film IF is formed on the barrier layer BA, and the undepicted element isolation regions (see FIG. 3) are formed.

Figure 25:
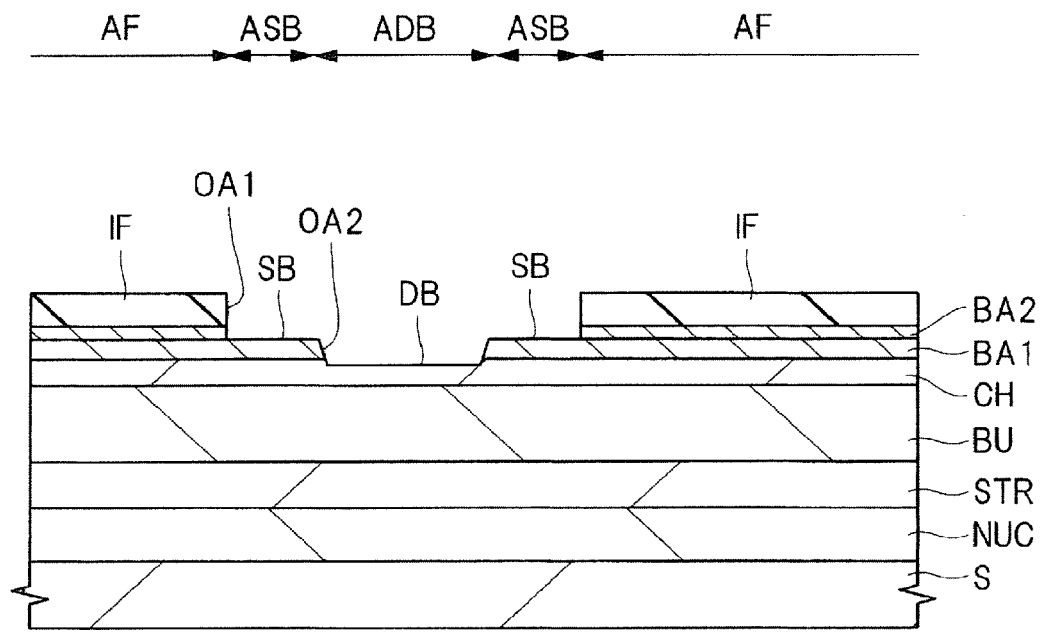
FIG. 25 is a sectional view illustrating a manufacturing step following FIG. 24 of the semiconductor device of the second embodiment.

Subsequently, as illustrated in FIGS. 23 to 25, the trench T including the openings OA1 and OA2 is formed.

For example, as illustrated in FIG. 23, the photoresist film PR1 is formed on the insulating film IF, and then the photoresist film PR1 in the gate electrode formation region (the region ASB and the region ADB) is removed by a photolithography process.

Subsequently, the insulating film IF and the high-Al barrier layer BA2 are dry-etched with the photoresist film PR1 as a mask, thereby the opening OA1, which runs through the insulating film IF and the high-Al barrier layer BA2 and exposes the surface of the low-Al barrier layer BA1, is formed. In other words, the high-Al barrier layer BA2 having a thickness T1 is removed by etching. A gas for the etching includes the gas for like etching in the first embodiment. In this case, the low-Al barrier layer BA1 having a thickness T2 remains on the bottom face of the opening OA1. The low-Al barrier layer BA1 may be etched to some depth following the etching of the high-Al barrier layer BA2. Subsequently, the photoresist film PR1 is removed.

Subsequently, as illustrated in FIG. 24, the photoresist film PR2 is formed on the insulating film IF and the low-Al barrier layer BA1, and the photoresist film PR2 in the region ADB is removed by a photolithography process. In other words, the photoresist film PR2 having an opening in the region ADB is formed on the insulating film IF and the low-Al barrier layer BA1.

Subsequently, the low-Al barrier layer BA1 and the channel layer CH are dry-etched with the photoresist film PR2 as a mask, thereby the opening OA2, which runs up to the middle of the channel layer CH through the insulating film IF and the barrier layer BA (the low-Al barrier layer BA1 and the high-Al barrier layer BA2), is formed. A gas for the etching includes the gas for like etching in the first embodiment. The etching-removed portions of the barrier layer BA and the channel layer CH have a total thickness T3. The thickness T3 corresponds to a difference in level between the bottom face of the opening OA1 and the bottom face of the opening OA2. Subsequently, the photoresist film PR2 is removed.

Consequently, as illustrated in FIG. 25, the trench T having the shallow bottom portions SB and the deep bottom portion DB is formed. Each shallow bottom portion SB corresponds to the bottom face of the opening OA1, and the deep bottom portion DB corresponds to the bottom face of the opening OA2. As described above, the opening OA1 is formed so as to enclose the opening OA2 (see FIG. 2).

Figure 26:
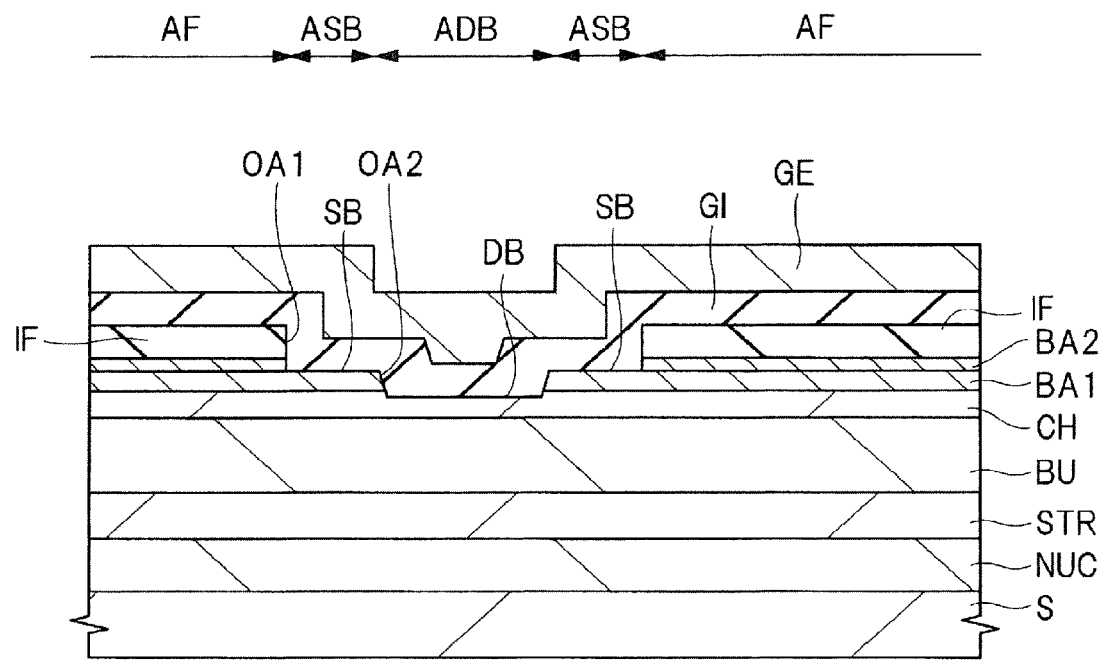
FIG. 26 is a sectional view illustrating a manufacturing step following FIG. 25 of the semiconductor device of the second embodiment.
Figure 27:
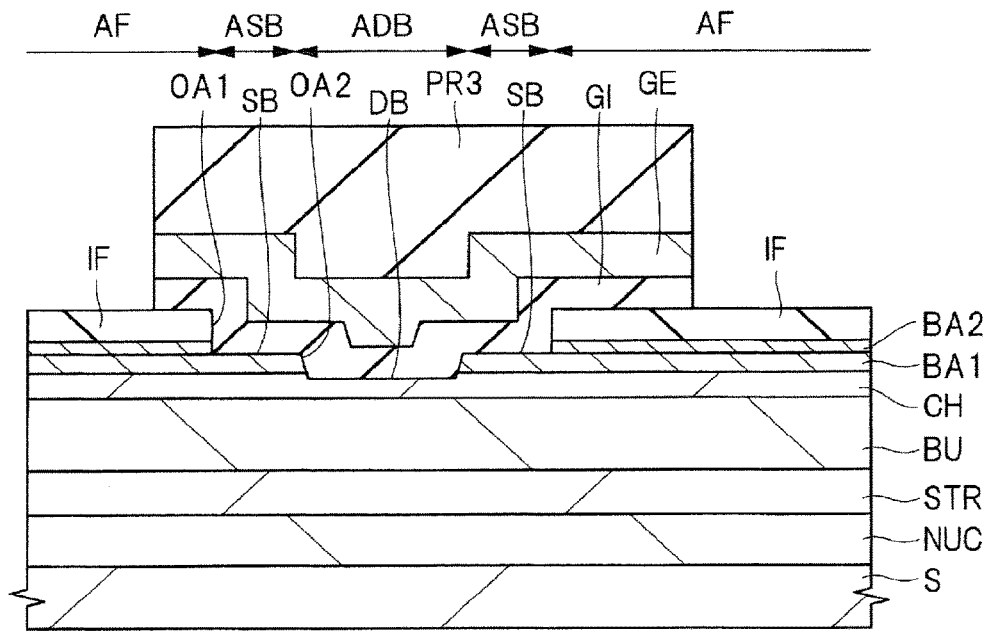
FIG. 27 is a sectional view illustrating a manufacturing step following FIG. 26 of the semiconductor device of the second embodiment.

Subsequently, as illustrated in FIGS. 26 and 27, the gate electrode GE is formed over the insulating film IF and over the inside of the trench T with the gate insulating film GI in between. The gate insulating film GI and the gate electrode GE can be formed as in the first embodiment. For example, as illustrated in FIG. 26, the material for the gate insulating film GI and the material for the gate electrode GE are stacked. Subsequently, as illustrated in FIG. 27, such materials are etched with the photoresist film PR3 as a mask. Subsequently, the photoresist film PR3 is removed.

Figure 28:
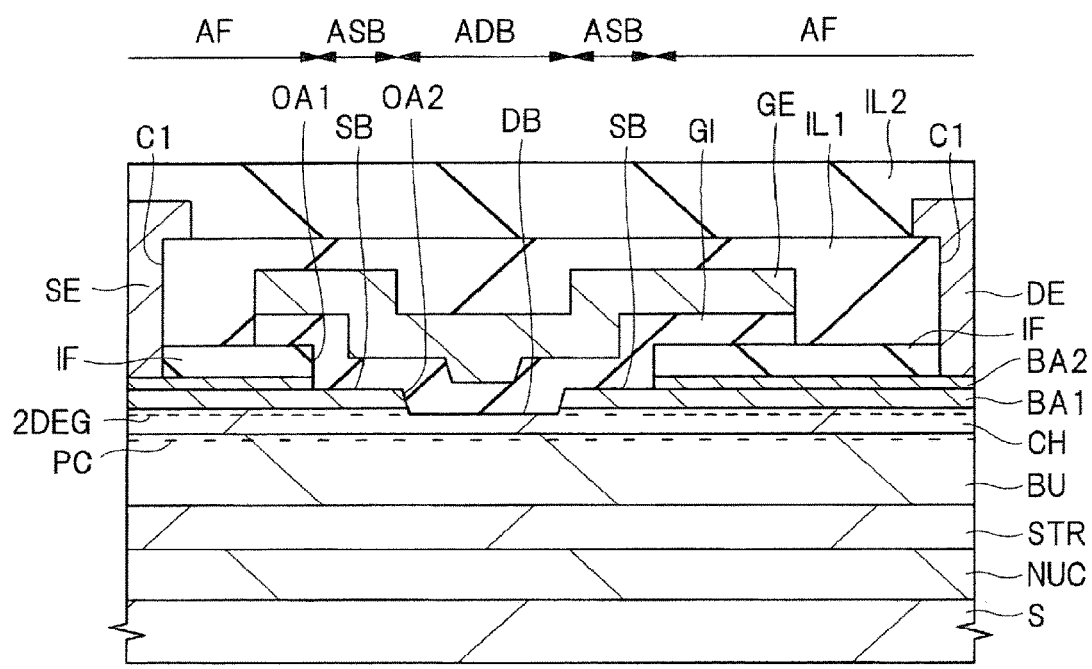
FIG. 28 is a sectional view illustrating a manufacturing step following FIG. 27 of the semiconductor device of the second embodiment.

Subsequently, as illustrated in FIG. 28, the interlayer insulating film IL1 is formed over the insulating film IF and the gate electrode GE, and then the source electrode SE and the drain electrode DE are formed. Subsequently, the interlayer insulating film IL2 is formed over the interlayer insulating film IL1, the source electrode SE, and the drain electrode DE. The interlayer insulating film IL1, the source electrode SE, the drain electrode DE, and the interlayer insulating film IL2 can each be formed using the same material and in the same way as in the first embodiment. Subsequently, as described in the first embodiment, plugs (PG) and interconnections (such as source lines SL and drain lines DL) are formed. A protective film may be formed on the top interconnection.

The semiconductor device of the second embodiment can be formed through the above-described steps. Such steps are merely an example, and the semiconductor device of the second embodiment may be manufactured through other steps.

Although the barrier layer BA has a double-layered structure in the second embodiment, the barrier layer BA may be configured of three or more layers. In such a case, it is preferred that the Al concentration is sequentially increased from a side close to the buffer layer BU.

Third Embodiment

Figure 29:
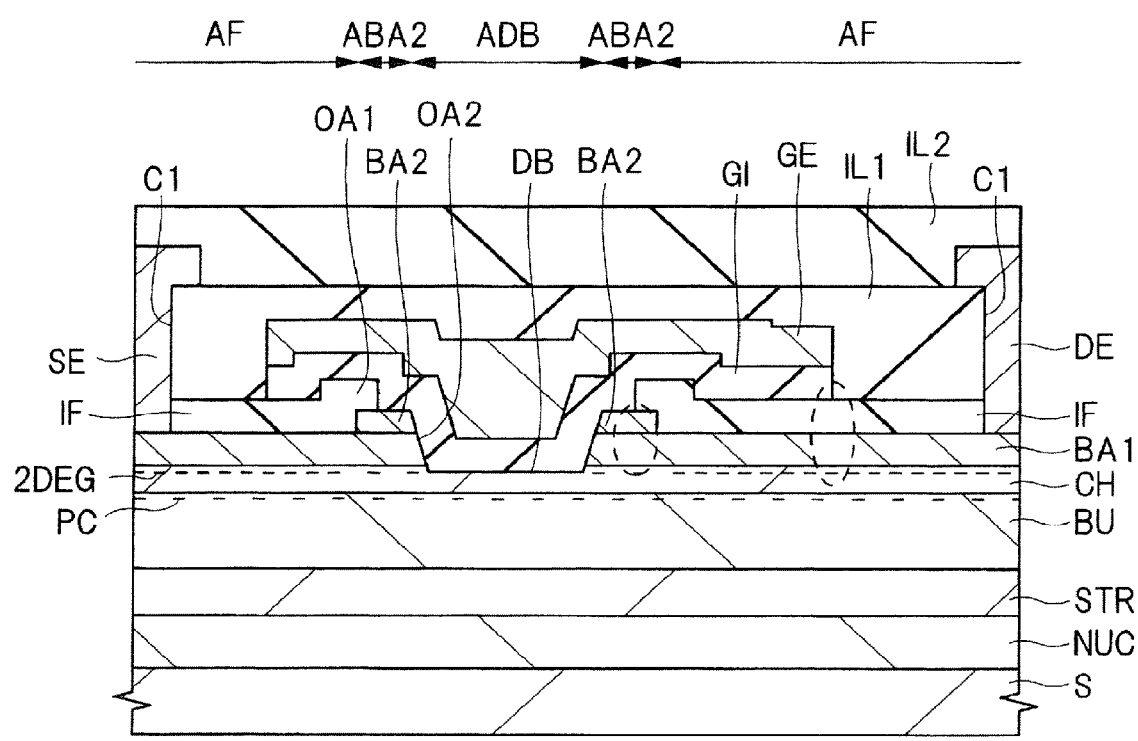
FIG. 29 is a sectional view illustrating a configuration of a semiconductor device of a third embodiment.

A semiconductor device of a third embodiment is now described in detail with reference to the accompanying drawings.
Structural Explanation
FIG. 29 is a sectional view illustrating a configuration of the semiconductor device of the third embodiment. The semiconductor device (semiconductor element) of the third embodiment illustrated in FIG. 29 is a MIS field effect transistor including nitride semiconductor. The semiconductor device can be used as a high-electron-mobility transistor type of power transistor. The semiconductor device of the third embodiment is a so-called recessed-gate semiconductor device.

As with the first embodiment (FIG. 1), the semiconductor device of the third embodiment has the nucleation layer NUC, the strain relaxation layer STR, the buffer layer BU, and the channel layer CH provided in this order on the substrate S. The barrier layer BA1 is provided on the channel layer CH, and the insulating film IF is provided on the barrier layer BA1.

In the third embodiment, the barrier layer BA1 has the opening OA2, and the insulating film IF has the opening OA1. The barrier layer BA2 is provided on the barrier layer BA1 on either side of the opening OA2. The barrier layer BA2 has an electron affinity larger than the barrier layer BA1. For example, the opening OA1 is disposed so as to enclose the formation region of the opening OA2 within the formation region of the gate electrode GE (see FIG. 2).

Figure 33:
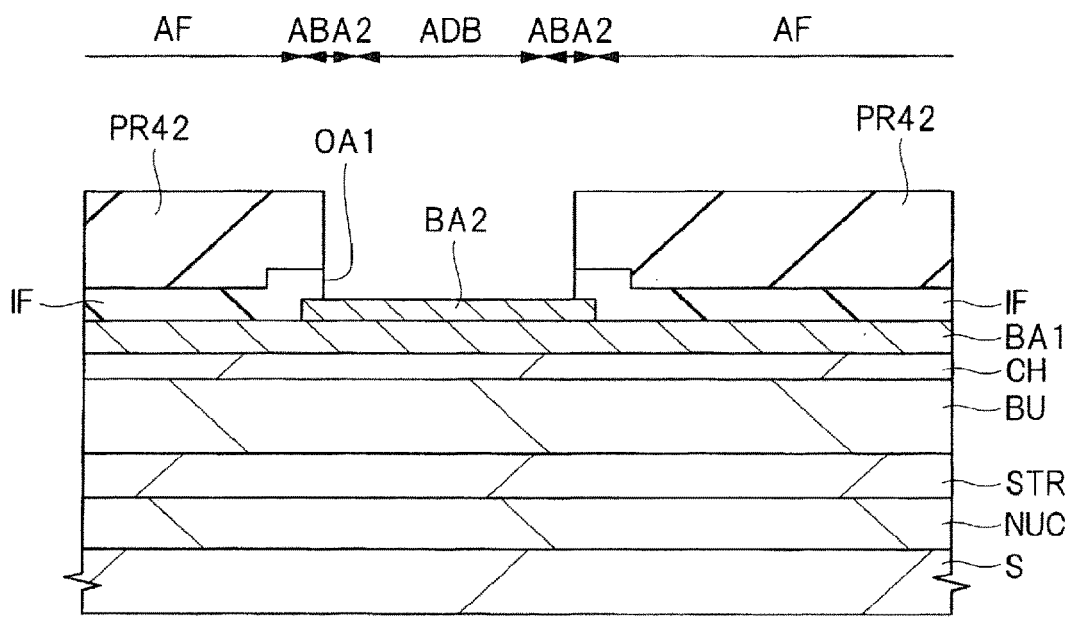
FIG. 33 is a sectional view illustrating a manufacturing step following FIG. 32 of the semiconductor device of the third embodiment.

The opening OA1 runs up to the surface of the barrier layer BA2 through the insulating film IF (see FIG. 33). The bottom face of the opening OA1 corresponds to the surface of the barrier layer BA2. The opening OA2 runs up to the middle of the channel layer CH through the insulating film IF and the barrier layers BA1 and BA2 (see FIG. 34). The bottom face of the opening OA2 is located within the channel layer CH. In other words, the channel layer CH is exposed from the bottom face of the opening OA2. The formation region of the opening OA2 is referred to as region ADB. A region between an end of the opening OA1 and an end of the opening OA2 is referred to as region ABA2. A region having no trench T is referred to as region AF. The region ABA2 corresponds to the formation region of the barrier layer BA2.

The gate electrode GE is provided within the trench T including the opening OA1 and the opening OA2 and on the insulating film IF with the gate insulating film GI in between.

In the third embodiment, the two-dimensional electron gas 2DEG generated in the vicinity of the interface between the channel layer CH and the barrier layer BA1 is also separated by the opening OA2 having the gate electrode GE therein. Hence, the semiconductor device of the third embodiment maintains OFF during application of no positive potential (threshold potential) to the gate electrode GE, and maintains ON during application of the positive potential (threshold potential) to the gate electrode GE. In this way, the semiconductor device performs normally-off operation.

The buffer layer BU is thus provided under the channel layer CH, thereby polarization charge (negative fixed charge) PC is generated in the buffer layer BU in the vicinity of the interface between the channel layer CH and the buffer layer BU. The polarization charge PC raises the conduction band, and thus allows the threshold potential to rise to a positive side (see FIG. 15). This improves normally-off operability.

The source electrode SE is provided on the barrier layer BA1 on one side (on the left side in FIG. 29) of the gate electrode GE. The drain electrode DE is provided on the barrier layer BA1 on the other side (on the right side in FIG. 29) of the gate electrode GE. The source electrode SE and the drain electrode DE are each disposed in and on the contact hole C1 provided in the interlayer insulating film IL1. The source electrode SE and the drain electrode DE are covered with the interlayer insulating film IL2.

The third embodiment is configured such that the barrier layer BA2 having an electron affinity larger than the barrier layer BA1 is disposed on the barrier layer BA1 in a region (region ABA2) on either side of the opening OA2, which decreases the concentration of the two-dimensional electron gas 2DEG in the region (region ABA2). Specifically, the barrier layer BA2 having a large electron affinity reduces a piezoelectric polarization effect of the underlying barrier layer BA1, and thus the concentration of the two-dimensional electron gas 2DEG is decreased. The concentration of the two-dimensional electron gas 2DEG on either side of the opening OA2 is thus decreased, thereby the conduction band-raising effect of the polarization charge PC is prevented from being reduced. This prevents a decrease in threshold potential, and thus improves normally-off operability.

The provision of the barrier layer BA2 allows individual adjustment of the concentration of the two-dimensional electron gas 2DEG between the region (region ABA2) on either side of the opening OA2 and the region (region AF) on either side of the opening OA1. Specifically, the barrier layer SA2 is not provided in the region (region AF) on either side of the opening OA1, which allows the concentration of the two-dimensional electron gas 2DEG to be higher in the region AF than in the region ABA2. This allows the ON resistance to be reduced.

When the threshold potential is applied to the gate electrode GE in the region (region ABA2) on either side of the opening OA2, a channel is induced therein. This allows the ON resistance to be reduced.

The provision of the two openings (OA1, OA2) having different depths divides the electric-field concentration portion below the gate electrode GE into two (see round portions enclosed by broken lines in FIG. 29). This relaxes electric-field concentration, and thus increases the gate breakdown voltage.

For example, an AlGaN layer is used as the barrier layer BA1 of the semiconductor device of the third embodiment, and a GaN layer is used as the barrier layer BA2 thereof. For example, an AlGaN layer having an Al concentration of 5° is used as the buffer layer BU, a GaN layer is used as the channel layer CH, and an AlGaN layer having an Al concentration of 30% and a thickness of about 12 mm is used as the barrier layer BA1. In such a case, the two-dimensional electron gas 2DEG has a concentration of about $8E12/cm^2$ in the region (region AF) on either side of the opening OA1. In this way, access resistance is sufficiently decreased between the drain and the gate, and between the source and the gate. The concentration of the two-dimensional electron gas 2DEG is low, for example, about $1E12/cm^2$ to $5E12/cm^2$, in the region (region ABA2) having the GaN layer as the barrier layer BA2. Such a concentration does not cause a decrease in threshold voltage.

In the third embodiment, as clarified in the manufacturing method described later, the barrier layer BA1 is not directly etched in the region (region ABA2) on either side of the opening OA2, and variations in the two-dimensional electron gas 2DEG are therefore suppressed, and thus a desired concentration of the two-dimensional electron gas 2DEG is easily obtained.

A planar layout of each portion of the semiconductor device of the third embodiment may be similar to that in the first embodiment (see FIGS. 2 and 3), for example.

The material for each portion of the semiconductor device of the third embodiment may be similar to that in the first embodiment.

Description of Manufacturing Method

Subsequently, a method of manufacturing the semiconductor device of the third embodiment is described with reference to FIGS. 30 to 35, while the configuration of the semiconductor device is further clarified. FIGS. 30 to 35 are each a sectional view illustrating a manufacturing step of the semiconductor device of the third embodiment.

Figures 30, 31:
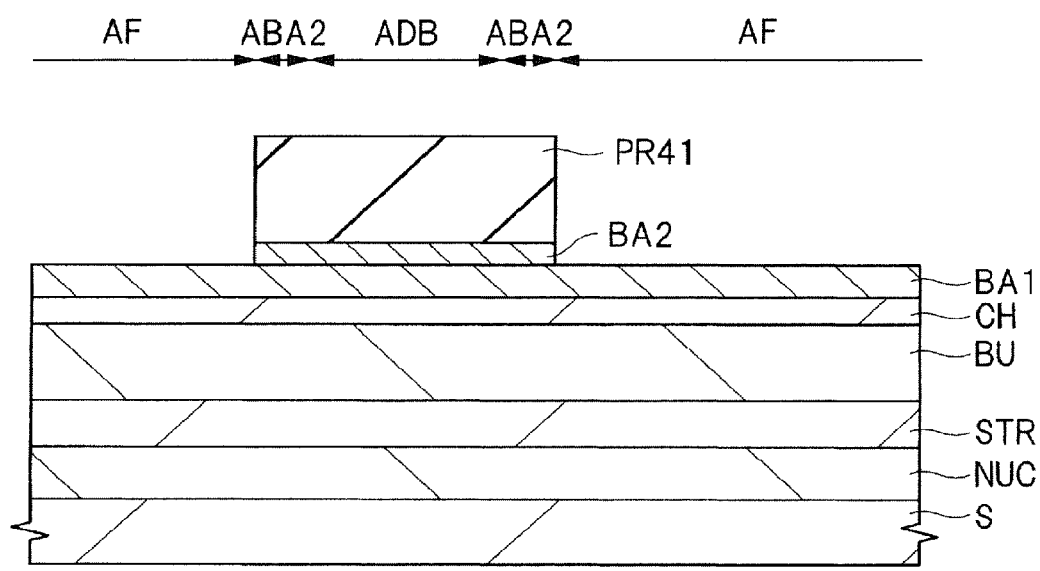
FIG. 30 is a sectional view illustrating a manufacturing step of the semiconductor device of the third embodiment.
FIG. 31 is a sectional view illustrating a manufacturing step following FIG. 30 of the semiconductor device of the third embodiment.

As illustrated in FIG. 30, the nucleation layer NUC, the strain relaxation layer STR, the buffer layer BU, the channel layer CH, and the barrier layers BA1 and BA2 are sequentially formed on the substrate S. The nucleation layer NUC, the strain relaxation layer SIR, the buffer layer BU, and the channel layer CH can each be formed using the same material and in the same way as in the first embodiment. Subsequently, the barrier layer BA1 and the barrier layer BA2 are sequentially formed on the channel layer CH. For example, an AlGaN layer as the barrier layer BA1 is heteroepitaxially grown on the channel layer CH at an Al concentration of 25 to 40% and a thickness of 5 to 30 nm by a metal organic chemical vapor deposition process or the like. Subsequently, a GaN layer as the barrier layer BA2 is heteroepitaxially grown on the barrier layer BA1 at a thickness of 5 to 20 nm by a metal organic chemical vapor deposition process or the like. For example, it is designed that the two-dimensional electron gas 2DEG has a concentration of $5E12/cm^2$ to $1E13/cm^2$ in the region (region AF) on either side of the opening OA1, and the two-dimensional electron gas 2DEG has a concentration of about $1E12/cm^2$ to $5E12/cm^2$ in the region (region ABA2) having the GaN layer.

Subsequently, as illustrated in FIG. 31, a photoresist film PR41 is formed on the barrier layer BA2, and then the photoresist film PR41 is left in the region ADB and the region ABA2 by a photolithography process. Subsequently, the barrier layer SA2 is dry-etched with the photoresist film PR41 as a mask, thereby the barrier layer BA2 is left in the region ADB and the region ABA2. A gas for the etching includes the gas for etching of the GaN layer described in the first embodiment. Subsequently, the photoresist film PR41 is removed.

Figure 32:
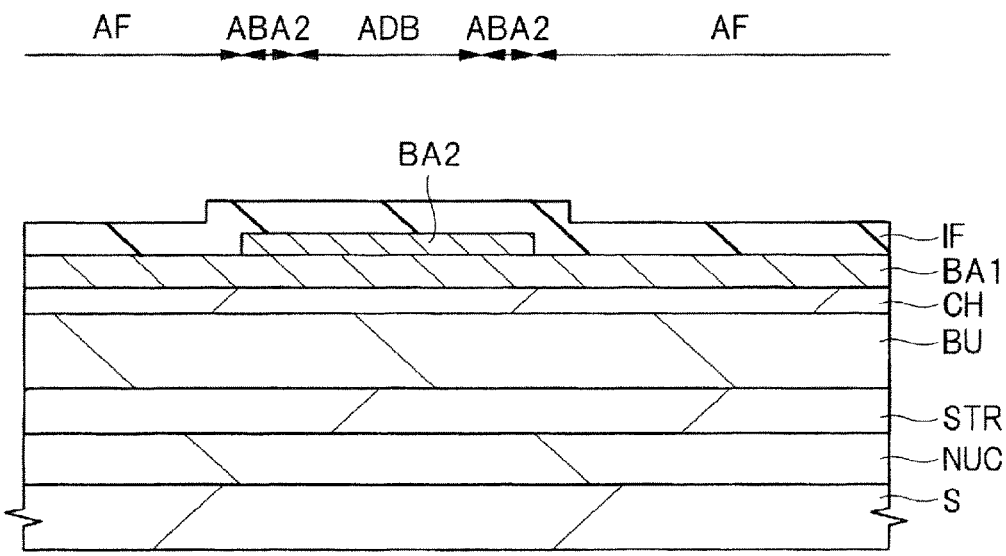
FIG. 32 is a sectional view illustrating a manufacturing step following FIG. 31 of the semiconductor device of the third embodiment.

Subsequently, as illustrated in FIG. 32, for example, a silicon nitride film as the insulating film IF is formed on the barrier layer BA1 and the barrier layer BA2 as in the first embodiment. Subsequently, the undepicted element isolation regions (see FIG. 3) are formed as in the first embodiment.

Figure 34:
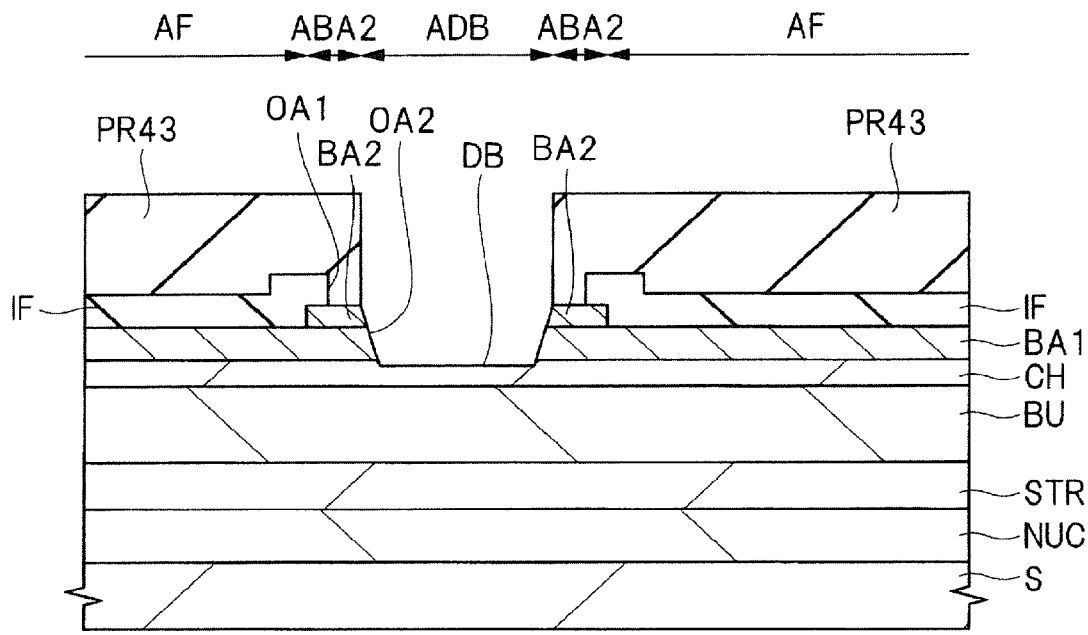
FIG. 34 is a sectional view illustrating a manufacturing step following FIG. 33 of the semiconductor device of the third embodiment.

Subsequently, the opening OA1 and the opening OA2 are formed as illustrated in FIGS. 33 and 34. For example, the opening OA1 is formed so as to enclose the opening OA2 (see FIG. 2). As illustrated in FIG. 33, a photoresist film PR42 is formed on the insulating film IF, and then the photoresist film PR42 in the region ABA2 and the region ADB is removed by a photolithography process.

Subsequently, the insulating film IF is dry-etched with the photoresist film PR42 as a mask, thereby the opening OA1 is formed. The barrier layer BA2 is exposed from the bottom face of the opening OA1. A gas for the etching includes the gas for like etching in the first embodiment. Subsequently, the photoresist film PR42 is removed. The insulating film IF having a width of about 0.1 μm may remain on the barrier layer BA2 due to mask misalignment or dimension errors in etching. In addition, the insulating film IF on the barrier layer BA1 may be etched in a width of about 0.1 μm.

Subsequently, as illustrated in FIG. 34, a photoresist film PR43 is formed on the insulating film IF and the barrier layer BA2, and the photoresist film PR43 in the region ADB is removed by a photolithography process. Subsequently, the barrier layer BA2, the barrier layer BA1, and the channel layer CH are dry-etched with the photoresist film PR43 as a mask, thereby the opening OA2, which runs up to the middle of the channel layer CH through the barrier layer BA2 and the barrier layer BA1, is formed. A gas for the etching includes the gas for etching of the GaN layer or the AlGaN layer described in the first embodiment. Subsequently, the photoresist film PR43 is removed. For example, the barrier layer BA2 has a width of about 0.2 to 5 µm.

Figure 35:
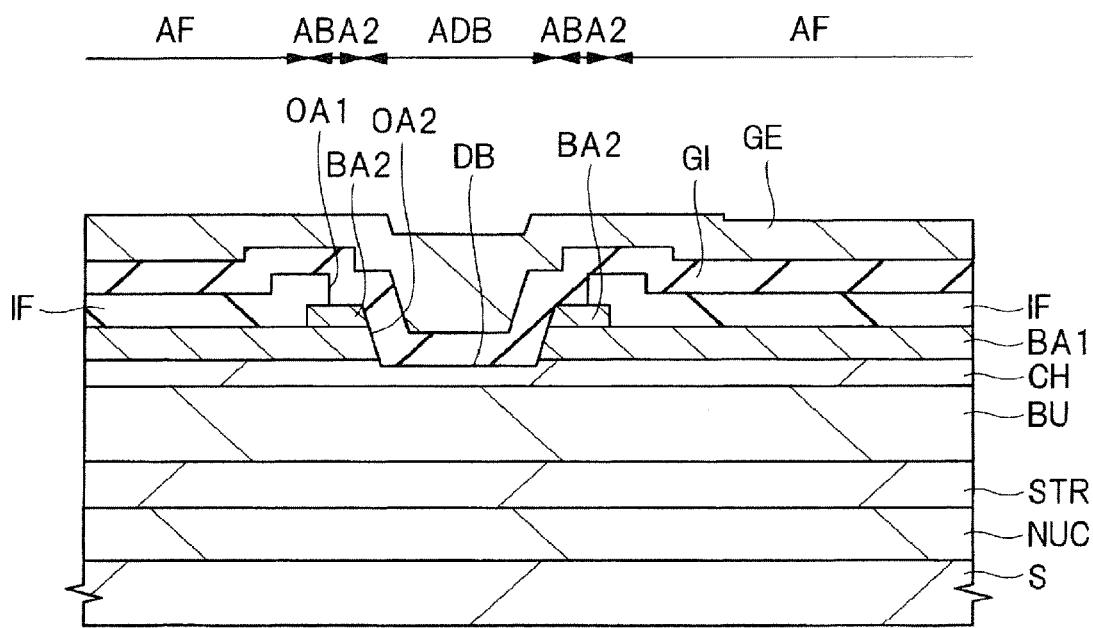
FIG. 35 is a sectional view illustrating a manufacturing step following FIG. 34 of the semiconductor device of the third embodiment.

Subsequently, the gate insulating film GI and the gate electrode GE are formed over the insulating film IF and over the inside of each of the openings OA1 and OA2. The gate insulating film GI and the gate electrode GE can be formed as in the first embodiment. For example, the material for the gate insulating film GI and the material for the gate electrode GE are stacked as illustrated in FIG. 35, and then the materials are etched (see FIG. 29).

Subsequently, as illustrated in FIG. 29, the interlayer insulating film IL1 is formed over the insulating film IF and the gate electrode GE, and then the source electrode SE and the drain electrode DE are formed. Subsequently, the interlayer insulating film IL2 is formed over the interlayer insulating film IL1, the source electrode SE, and the drain electrode DE. The interlayer insulating film IL1, the source electrode SE, the drain electrode DE, and the interlayer insulating film IL2 can each be formed using the same material and in the same way as in the first embodiment. Subsequently, as described in the first embodiment, plugs (PG) and interconnections (such as source lines SL and drain lines DL) are formed. A protective film may be formed on the top interconnection.

The semiconductor device of the third embodiment can be formed through the above-described steps. Such steps are merely an example, and the semiconductor device of the third embodiment may be manufactured through other steps.

Fourth Embodiment

Figure 36:
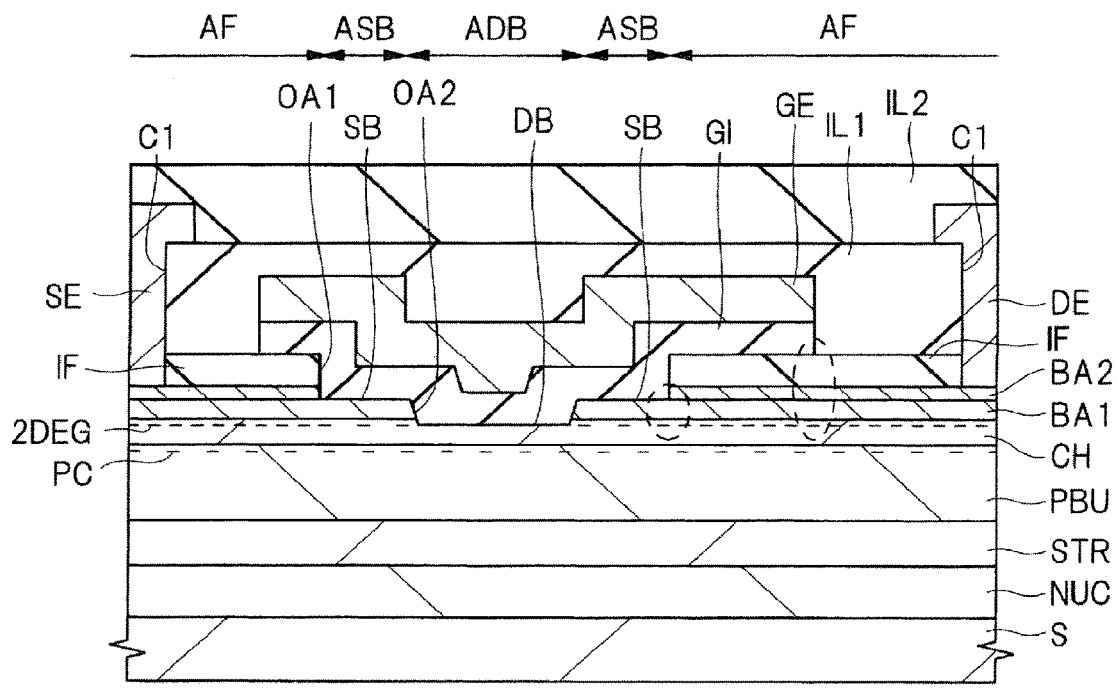
FIG. 36 is a sectional view illustrating a configuration of a semiconductor device of application A in a fourth embodiment.

In a fourth embodiment, applications of the above-described embodiments are described.
Application A FIG. 36 is a sectional view illustrating a configuration of a semiconductor device of application A in the fourth embodiment. As illustrated in FIG. 36, the semiconductor device of the second embodiment (FIG. 20) may include a buffer layer PBU containing a p-type impurity. Since the semiconductor device is similar to the semiconductor device of the second embodiment (FIG. 20) except for the configuration of the buffer layer PBU, like configurations and like manufacturing steps thereof will not be described.

When the buffer layer PBU containing the p-type impurity, for example, p-type AlGaN or p-type GaN, is thus provided, the concentration of the two-dimensional electron gas 2DEG in the region ASB is also lower than that in the region AF, and thus the effect of raising the threshold voltage can be enhanced.

Figure 37:
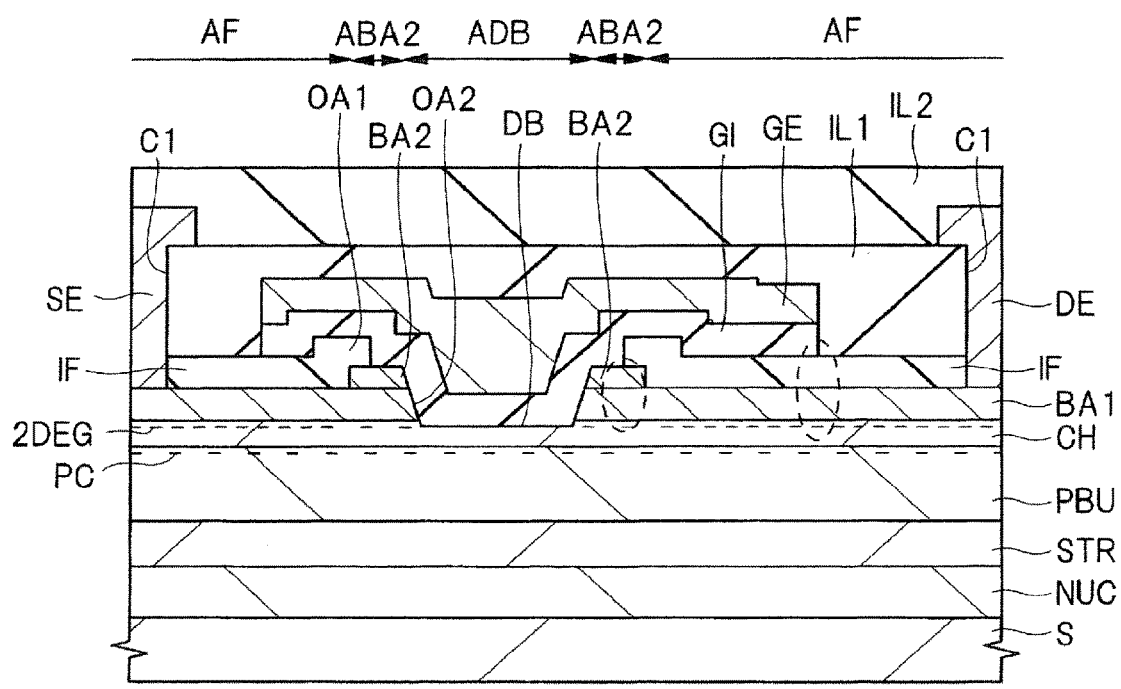
FIG. 37 is a sectional view illustrating a configuration of a semiconductor device of application B in the fourth embodiment.

While not illustrated, the semiconductor device of the second embodiment (FIG. 20) may not include the buffer layer BU, or may include a buffer layer PBU including a p-type GaN layer. In this way, even if the buffer layer is not provided, the concentration of the two-dimensional electron gas 2DEG in the region ASB is controlled to be lower than that in the region AF, thereby a decrease in channel potential can be suppressed (see the application 2 of the first embodiment). This prevents a decrease in threshold potential, and thus improves normally-off operability.
Application B FIG. 37 is a sectional view illustrating a configuration of a semiconductor device of application B in the fourth embodiment. As illustrated in FIG. 37, the semiconductor device of the third embodiment (FIG. 29) may include a buffer layer PBU containing a p-type impurity. Since the semiconductor device is similar to the semiconductor device of the third embodiment (FIG. 29) except for the configuration of the buffer layer PBU, like configurations and like manufacturing steps thereof will not be described.

When the buffer layer PBU containing the p-type impurity, for example, p-type AlGaN or p-type GaN, is thus provided, the concentration of the two-dimensional electron gas 2DEG in the region ASB is also lower than that in the region AF, and thus the effect of raising the threshold voltage can be enhanced.

Figure 38:
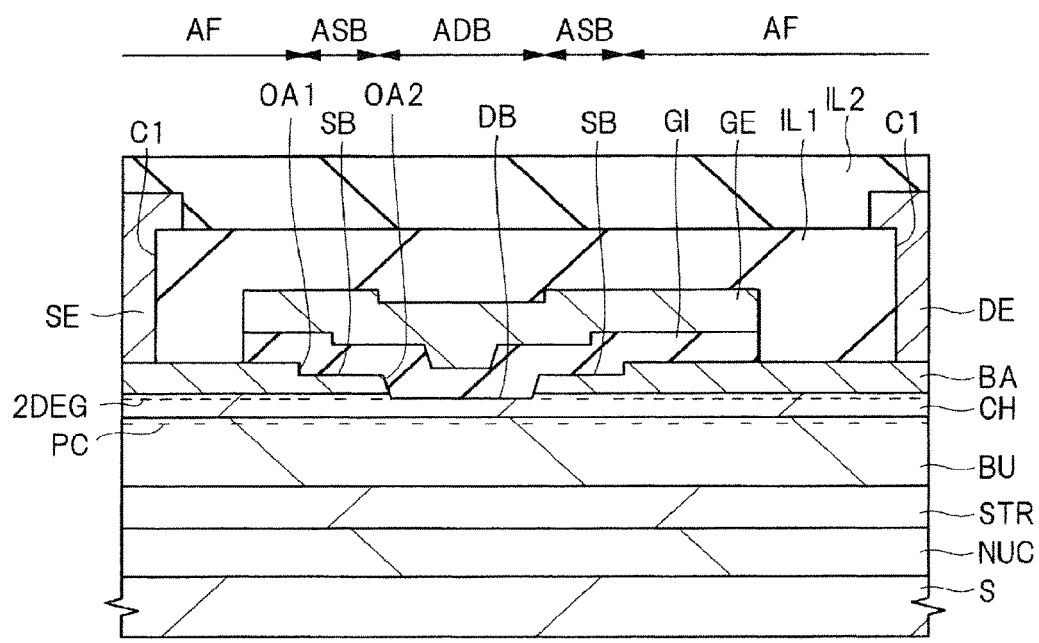
FIG. 38 is a sectional view illustrating a configuration of a semiconductor device of application C in the fourth embodiment.

While not illustrated, the semiconductor device of the third embodiment (FIG. 29) may not include the buffer layer BU, or may include a buffer layer PBU including a p-type GaN layer. In this way, even if the buffer layer is not provided, the concentration of the two-dimensional electron gas 2DEG in the region ASB is controlled to be lower than that in the region AF, thereby a decrease in channel potential can be suppressed (see the application 2 of the first embodiment). This prevents a decrease in threshold potential, and thus improves normally-off operability.
Application C Although the semiconductor device illustrated in FIG. 1 has the insulating film IF on the barrier layer BA, the insulating film IF may not be provided. FIG. 38 is a sectional view illustrating a configuration of a semiconductor device of application C in the fourth embodiment.

Since the semiconductor device of the application C is similar to the semiconductor device of FIG. 1 except that the insulating film IF is not provided, like configurations and like manufacturing steps thereof will not be described.

If the insulating film IF is thus not provided, effects substantially similar to those of the semiconductor device of FIG. 1 can also be provided. In addition, even if the insulating film IF is not provided, a difference in level exists due to the shallow bottom portion SB and the surface of the barrier layer BA. Hence, as described in detail in the first embodiment, electric-field concentration is relaxed, and thus the gate breakdown voltage is increased (see FIG. 1).

Figure 39:
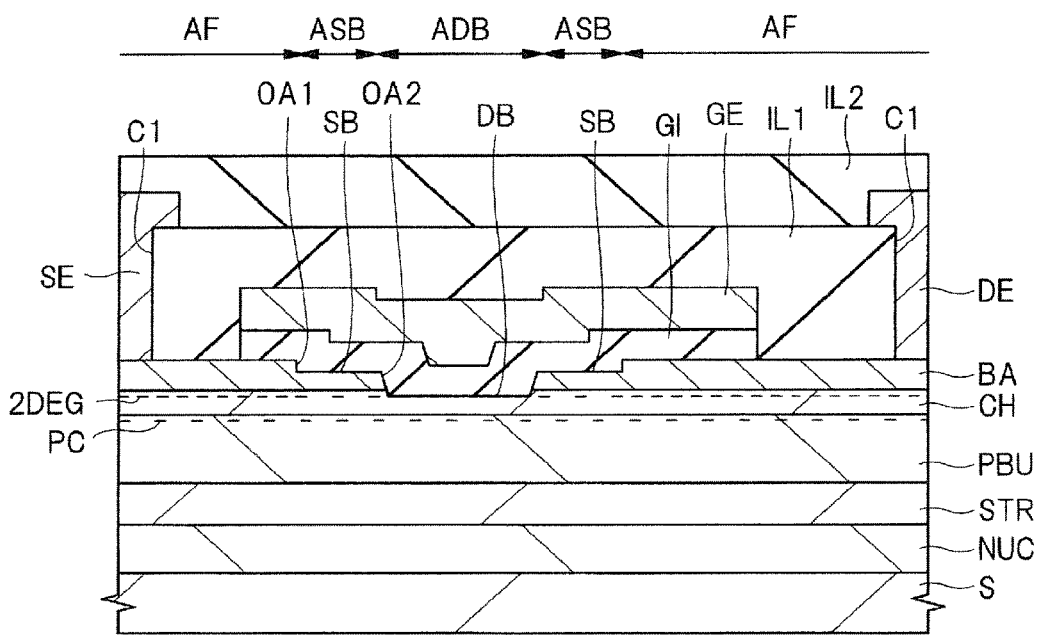
FIG. 39 is a sectional view illustrating another configuration of the semiconductor device of the application C in the fourth embodiment.
Figure 40:
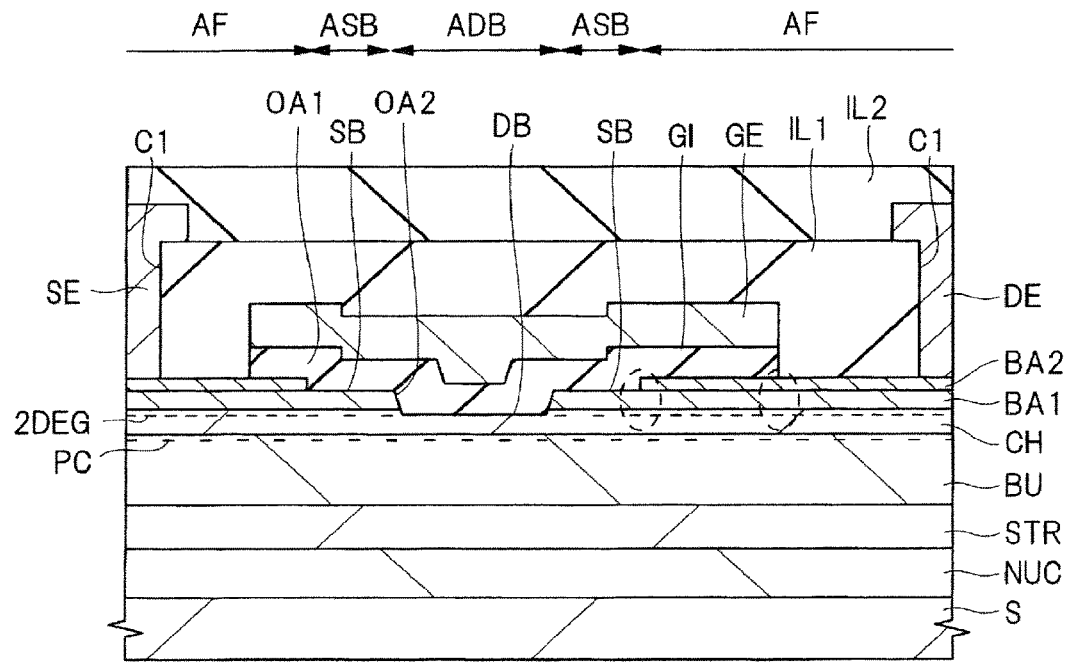
FIG. 40 is a sectional view illustrating a configuration of a semiconductor device of application D in the fourth embodiment.

FIG. 39 is a sectional view illustrating another configuration of the semiconductor device of the application C in the fourth embodiment. As illustrated in FIG. 39, a p-type buffer layer PBU may be provided in place of the buffer layer BU of the semiconductor device illustrated in FIG. 38. When the p-type AlGaN buffer layer is thus provided, the effect of raising the threshold voltage can be provided as in the application 1 of the first embodiment, for example.
Application D Although the semiconductor device illustrated in FIG. 20 has the insulating film IF on the barrier layer BA2, the insulating film IF may not be provided. FIG. 40 is a sectional view illustrating a configuration of a semiconductor device of application D in the fourth embodiment.

Since the semiconductor device of the application D is similar to the semiconductor device of FIG. 20 except that the insulating film IF is not provided, like configurations and like manufacturing steps thereof will not be described.

If the insulating film IF is thus not provided, effects substantially similar to those of the semiconductor device of FIG. 20 can also be provided. In addition, even if the insulating film IF is not provided, a difference in level exists due to the shallow bottom portion SB and the surface of the barrier layer BA. Hence, as described in detail in the first embodiment, electric-field concentration is relaxed, and thus the gate breakdown voltage is increased.

Figure 41:
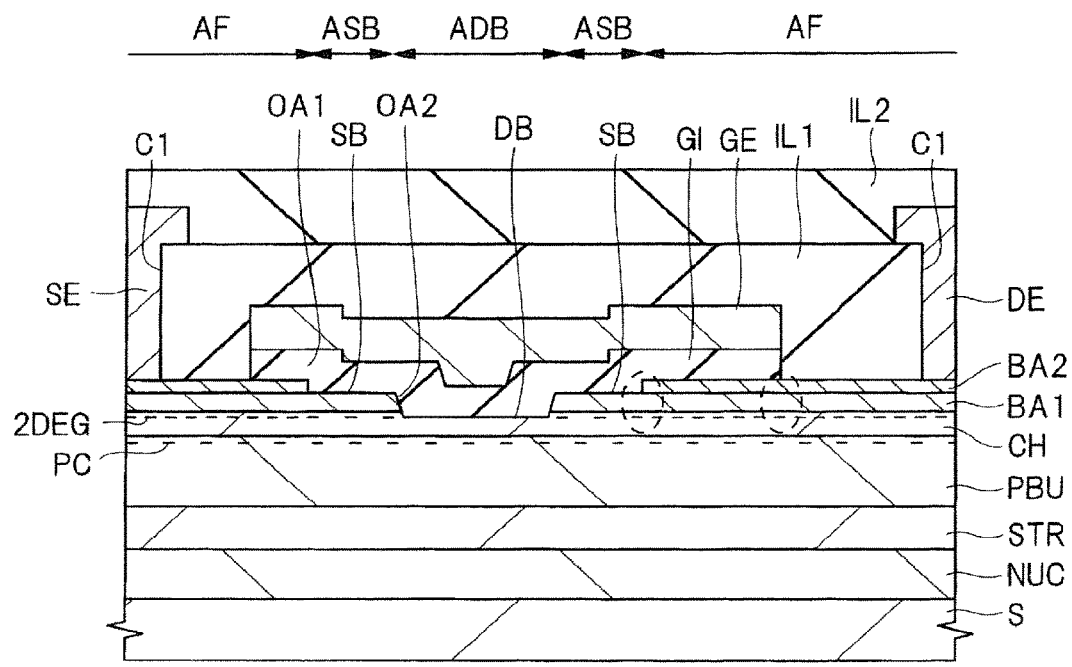
FIG. 41 is a sectional view illustrating another configuration of the semiconductor device of the application D in the fourth embodiment.

FIG. 41 is a sectional view illustrating another configuration of the semiconductor device of the application D in the fourth embodiment. As illustrated in FIG. 41, a p-type buffer layer PBU may be used in place of the buffer layer BU of the semiconductor device illustrated in FIG. 40. When the p-type buffer layer is thus provided, the effect of raising the threshold voltage can be enhanced as described in the application 1 of the first embodiment, for example.

Application E

Figure 42:
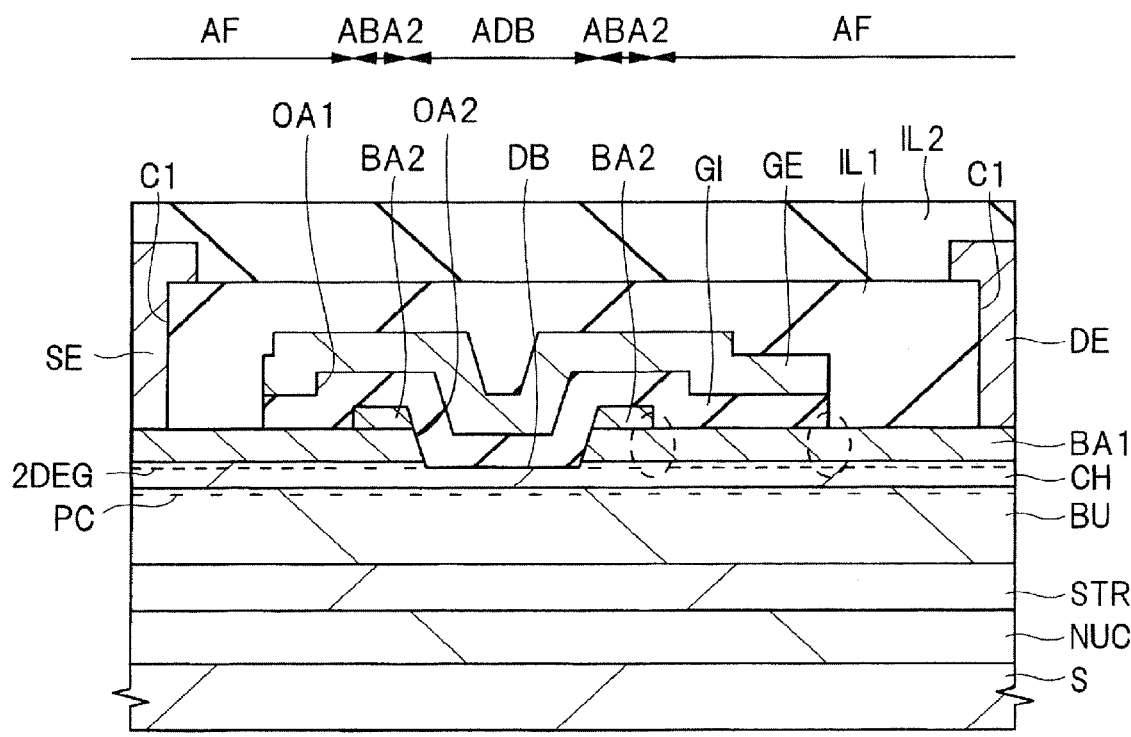
FIG. 42 is a sectional view illustrating a configuration of a semiconductor device of application E in the fourth embodiment.

Although the semiconductor device illustrated in FIG. 29 has the insulating film IF on the barrier layer BA1, the insulating film IF may not be provided. FIG. 42 is a sectional view illustrating a configuration of a semiconductor device of application E in the fourth embodiment.

Since the semiconductor device of the application E is similar to the semiconductor device of FIG. 29 except that the insulating film IF is not provided, like configurations and like manufacturing steps thereof will not be described.

If the insulating film IF is thus not provided, effects substantially similar to those of the semiconductor device of FIG. 29 can also be provided. In addition, even if the insulating film IF is not provided, a difference in level exists between the surface of the barrier layer BA2 and the surface of the barrier layer BA1. Hence, electric-field concentration is relaxed, and thus the gate breakdown voltage is increased.

Figure 43:
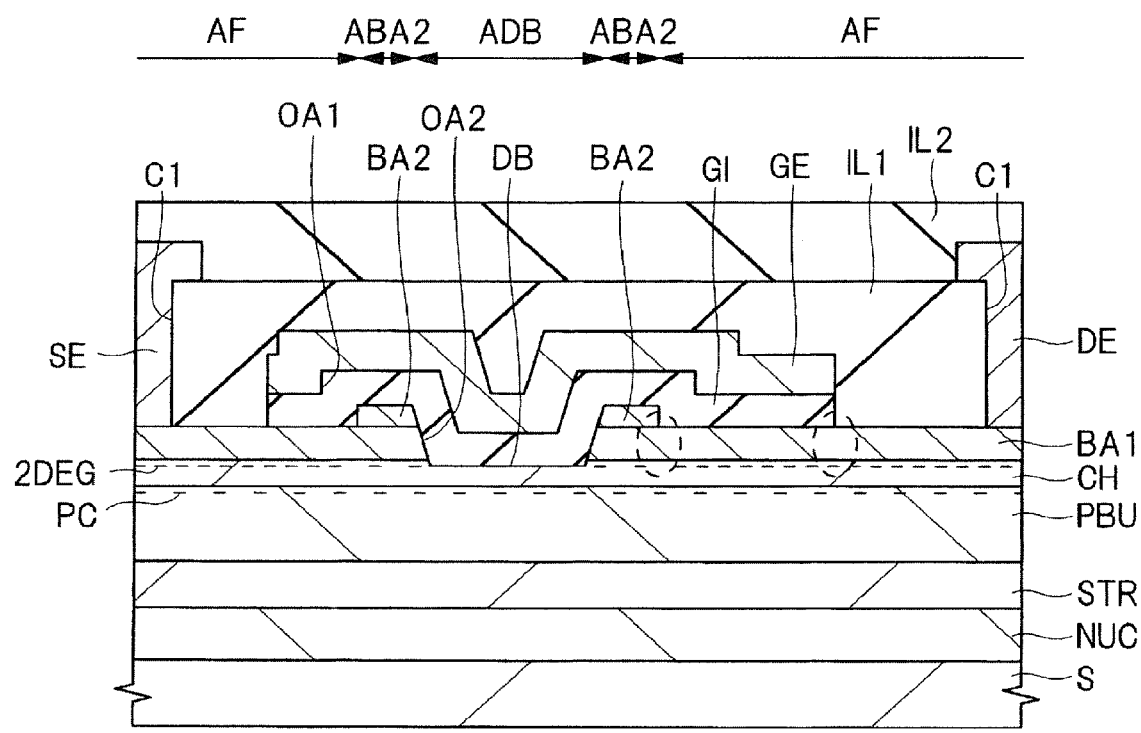
FIG. 43 is a sectional view illustrating another configuration of the semiconductor device of the application E in the fourth embodiment.

FIG. 43 is a sectional view illustrating another configuration of the semiconductor device of the application E in the fourth embodiment. As illustrated in FIG. 43, a p-type buffer layer PBU may be used in place of the buffer layer BU of the semiconductor device illustrated in FIG. 42. When the p-type buffer layer is thus used, the effect of raising the threshold voltage can be enhanced as described in the application 1 of the first embodiment, for example.

Fifth Embodiment

In the first embodiment (FIGS. 1 and 6), a side face of the insulating film IF, and part of a side face of the barrier layer BA, the partial side face corresponding to the thickness T1 from the surface of the barrier layer BA, are exposed from a side face (sidewall) of the opening OA1. However, the side face of the insulating film IF may be retracted toward the source electrode SE or the drain electrode DE. Since the semiconductor device of a fifth embodiment is similar to the semiconductor device of the first embodiment except for the position of the side face of the insulating film IF, corresponding configurations and corresponding manufacturing steps thereof will not be described in detail.

A semiconductor device of the fifth embodiment is now described in detail with reference to the accompanying drawings.

Structural Explanation

Figure 44:
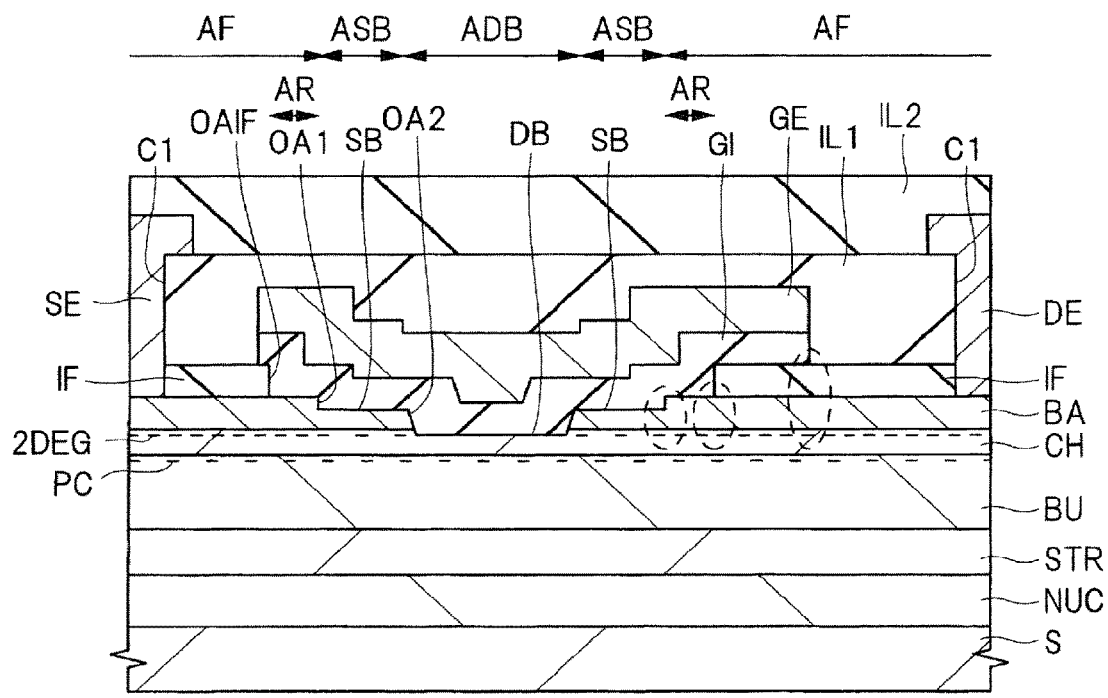
FIG. 44 is a sectional view illustrating a configuration of a semiconductor device of a fifth embodiment.

FIG. 44 is a sectional view illustrating a configuration of the semiconductor device of the fifth embodiment. The semiconductor device (semiconductor element) of the fifth embodiment illustrated in FIG. 44 is a MIS field effect transistor including nitride semiconductor. The semiconductor device can be used as a high-electron-mobility power transistor type of power transistor. The semiconductor device of the fifth embodiment is a so-called recessed-gate semiconductor device.

As with the first embodiment (FIG. 1), the semiconductor device of the fifth embodiment has the nucleation layer NUC, the strain relaxation layer STR, the buffer layer BU, the channel layer CH, and the barrier layer BA provided in this order on the substrate S. The insulating film IF is provided on the barrier layer BA.

The gate electrode GE is provided within the opening OAIF, the opening OA1, and the opening OA2 and on the insulating film IF with the gate insulating film GI in between. For example, the opening OA1 is disposed so as to enclose the formation region of the opening OA2 (see FIG. 2), and the opening OAIF is disposed so as to enclose the formation region of the opening OA1.

Figure 45:
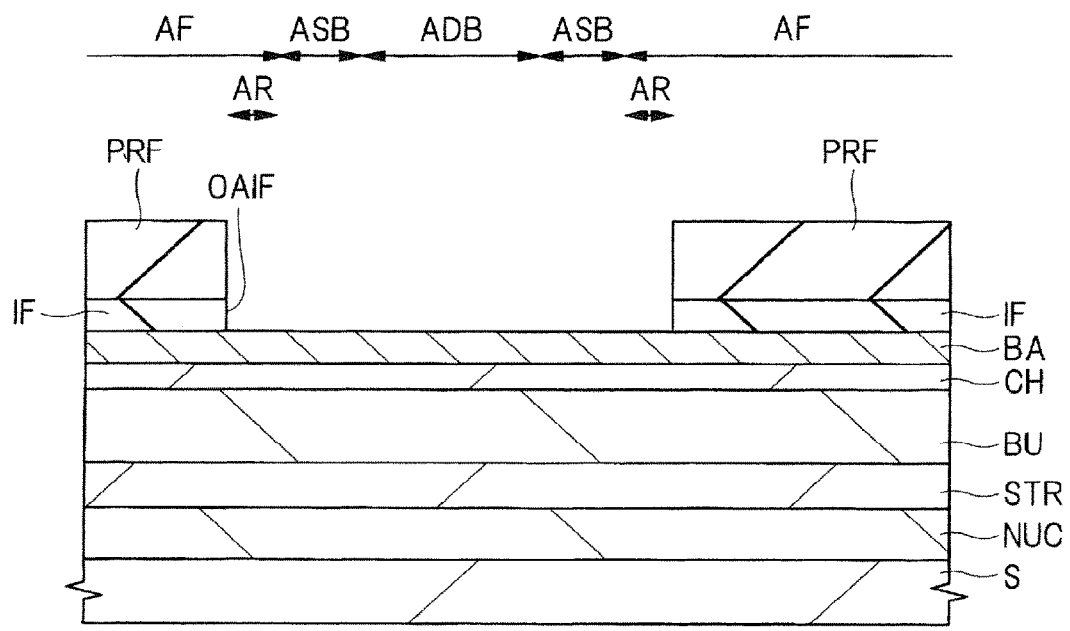
FIG. 45 is a sectional view illustrating a manufacturing step of the semiconductor device of the fifth embodiment.

The opening OAIF runs up to the surface of the barrier layer BA through the insulating film IF (see FIG. 45). The opening OA1 runs up to the middle of the barrier layer BA through the insulating film IF (see FIG. 46). The bottom face of the opening OA1 corresponds to the shallow bottom portion SB. The shallow bottom portion SB is located within the barrier layer BA. In other words, the barrier layer BA is exposed from the shallow bottom portion SB. In other words, the barrier layer BA remains under the shallow bottom portion SB. The opening OA2 runs up to the middle of the channel layer CH through the insulating film IF and the barrier layer BA (see FIG. 47). The bottom face of the opening OA2 corresponds to the deep bottom portion DB. The deep bottom portion DB is located within the channel layer CH. In other words, the channel layer CH is exposed from the deep bottom portion DB. The formation region of the shallow bottom portion SB is referred to as region ASB. The formation region of the deep bottom portion DB is referred to as region ADB. A region having no trench T (region with the barrier layer BA being unetched) is referred to as region AF. The region where the surface of the barrier layer BA is exposed (the region between the opening OAIF and the opening OA1) is referred to as region AR. The region where the surface of the barrier layer BA is exposed corresponds to the retracted face of the insulating film IF.

In the fifth embodiment, the two-dimensional electron gas 2DEG generated in the vicinity of the interface between the channel layer CH and the barrier layer BA is also separated by the opening OA2 having the gate electrode GE therein. Hence, the semiconductor device of the fifth embodiment maintains OFF during application of no positive potential (threshold potential) to the gate electrode GE, and maintains ON during application of the positive potential (threshold potential) to the gate electrode GE. In this way, the semiconductor device performs normally-off operation.

The buffer layer BU is provided under the channel layer CH, thereby polarization charge (negative fixed charge) PC is generated in the buffer layer BU in the vicinity of the interface between the channel layer CH and the buffer layer BU. The polarization charge PC raises the conduction band, and thus allows the threshold potential to rise to a positive side (see FIG. 15). This improves normally-off operability.

The source electrode SE is provided on the barrier layer BA on one side (on the left side in FIG. 44) of the gate electrode GE. The drain electrode DE is provided on the barrier layer BA on the other side (on the right side in FIG. 44) of the gate electrode GE. The source electrode SE and the drain electrode DE are each disposed in and on the contact hole C1 provided in the interlayer insulating film IL1. The source electrode SE and the drain electrode DE are covered with the interlayer insulating film IL2.

As with the first embodiment, the semiconductor device of the fifth embodiment is also configured such that the thin barrier layer BA remains in the shallow bottom portion SB on either side of the deep bottom portion DB, which decreases the concentration of the two-dimensional electron gas 2DEG below the shallow bottom portion SB. The concentration of the two-dimensional electron gas 2DEG below the shallow bottom portion SB is thus decreased, thereby the conduction hand-raising effect of the polarization charge PC is prevented from being reduced. This prevents a decrease in threshold potential, and thus improves normally-off operability.

The provision of the shallow bottom portion SB allows individual adjustment of the concentration of the two-dimensional electron gas 2DEG between the region ASB having the shallow bottom portion SB therein and the region AF having no trench T. Hence, the concentration of the two-dimensional electron gas 2DEG in the region AF can be increased by, for example, increasing the Al concentration of the barrier layer, and thus the ON resistance can be decreased.

When the threshold potential is applied to the gate electrode GE in the shallow bottom. portion SB, a channel is induced therein. This allows the ON resistance to be reduced.

The provision of the shallow bottom portion SB divides into two the electric-field concentration portion below the gate electrode GE. In addition, the side face of the insulating film IF is retracted toward the source electrode SE or the drain electrode DE, which eventually divides the electric-field concentration portion into three (see round portions enclosed by broken lines in FIG. 44). This relaxes electric-field concentration, and thus increases the gate breakdown voltage.

Description of Manufacturing Method

Subsequently, a method of manufacturing the semiconductor device of the fifth embodiment is described with reference to FIGS. 45 to 48, while the configuration of the semiconductor device is further clarified. FIGS. 45 to 48 are each a sectional view illustrating a manufacturing step of the semiconductor device of the fifth embodiment.

As illustrated in FIG. 45, the nucleation layer NUC, the strain relaxation layer STR, the buffer layer BU, the channel layer CH, the barrier layer BA, and the insulating film IF are sequentially formed on the substrate S. Such layers can each be formed using the same material and in the same way as in the first embodiment. Subsequently, the undepicted element isolation regions (see FIG. 3) are formed.

Subsequently, the opening OAIF, the opening OA2, and the opening OA1 are sequentially formed (see FIGS. 45 to 47). For example, a photoresist film PRF is formed on the insulating film IF, and then the photoresist film PRF in the gate electrode formation region (the region ASB, the region ADB, and the region AR) is removed by a photolithography process. Subsequently, the insulating film IF is dry-etched with the photoresist film PRF as a mask, thereby the opening OAIF, which runs through the insulating film IF and exposes the surface of the barrier layer BA, is formed. A gas for the etching includes the gas for etching of the insulating film IF described in the first embodiment. Subsequently, the photoresist film PRF is removed.

Figure 46:
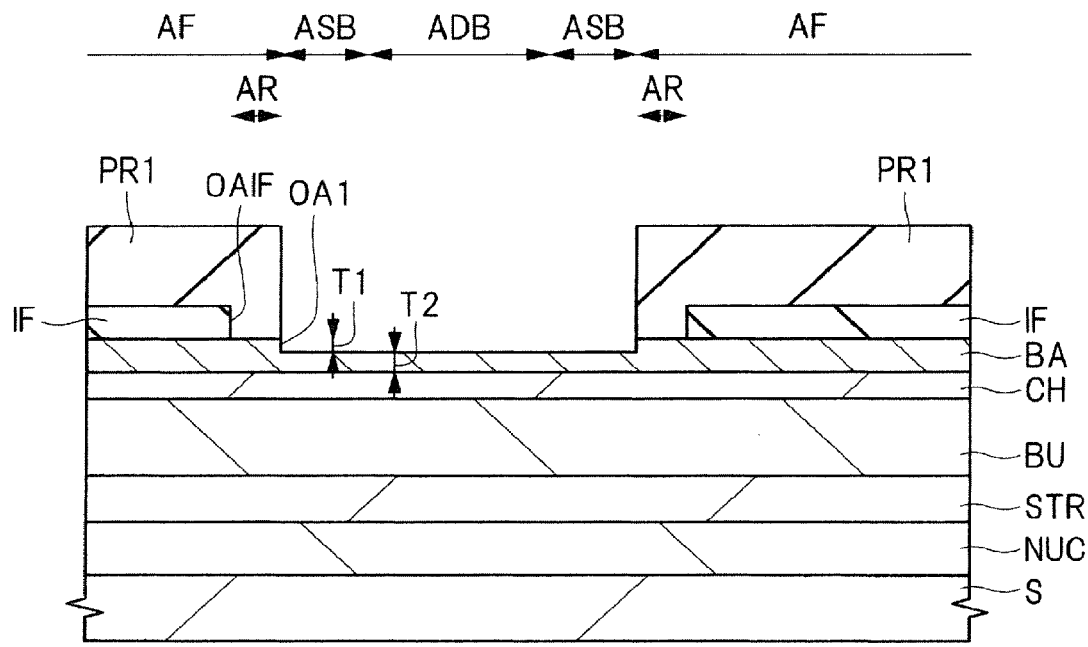
FIG. 46 is a sectional view illustrating a manufacturing step following FIG. 45 of the semiconductor device of the fifth embodiment.

Subsequently, as illustrated in FIG. 46, the photoresist film PR1 is formed on the insulating film IF and the barrier layer BA, and the photoresist film PR1 in the region ADB and the region ASB is removed by a photolithography process. Subsequently, the barrier layer BA is removed by etching by the thickness T1 from the surface thereof. A gas for the etching includes the gas for like etching in the first embodiment. In this case, the barrier layer BA having a thickness T2 remains on the bottom face of the opening OA1. Subsequently, the photoresist film PR1 is removed.

Figure 47:
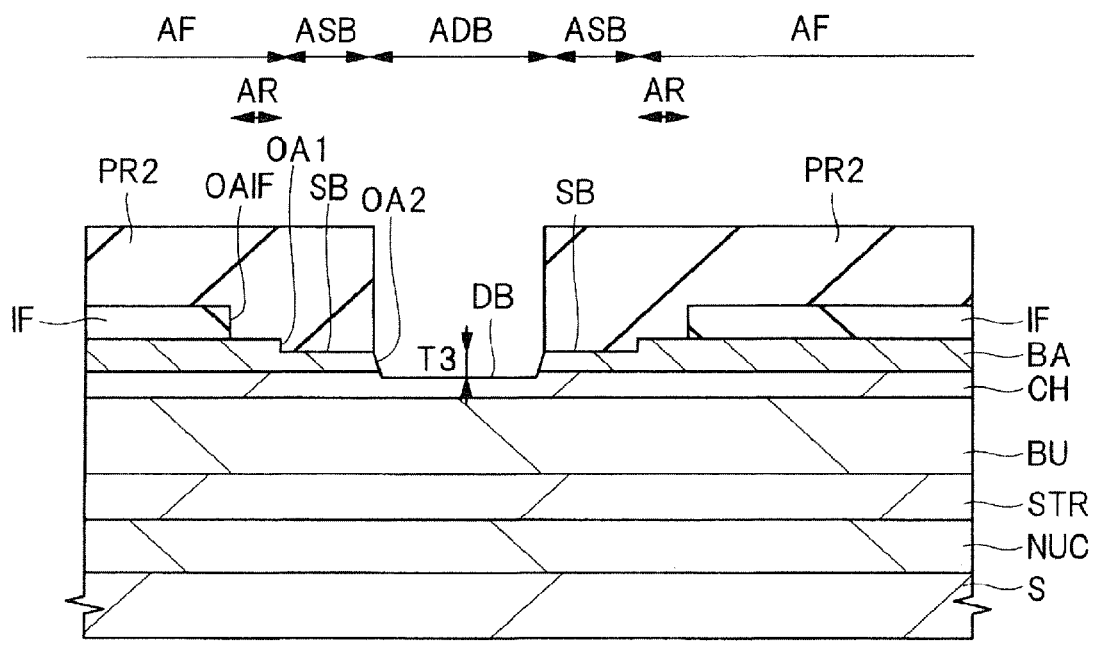
FIG. 47 is a sectional view illustrating a manufacturing step following FIG. 46 of the semiconductor device of the fifth embodiment.

Subsequently, as illustrated in FIG. 47, the photoresist film PR2 is formed on the insulating film IF and the barrier layer BA, and the photoresist film PR2 in the region ADB is removed by a photolithography process.

Subsequently, the barrier layer BA and the channel layer CH are dry-etched with the photoresist film PR2 as a mask, thereby the opening OA2, which runs up to the middle of the channel layer CH through the barrier layer BA, is formed. A gas for the etching includes the gas for like etching in the first embodiment. The etching-removed portions of the barrier layer BA and the channel layer CH have a total thickness T3. The thickness T3 corresponds to a difference in level between the bottom face of the opening OA1 and the bottom face of the opening OA2. Subsequently, the photoresist film PR2 is removed.

Figure 48:
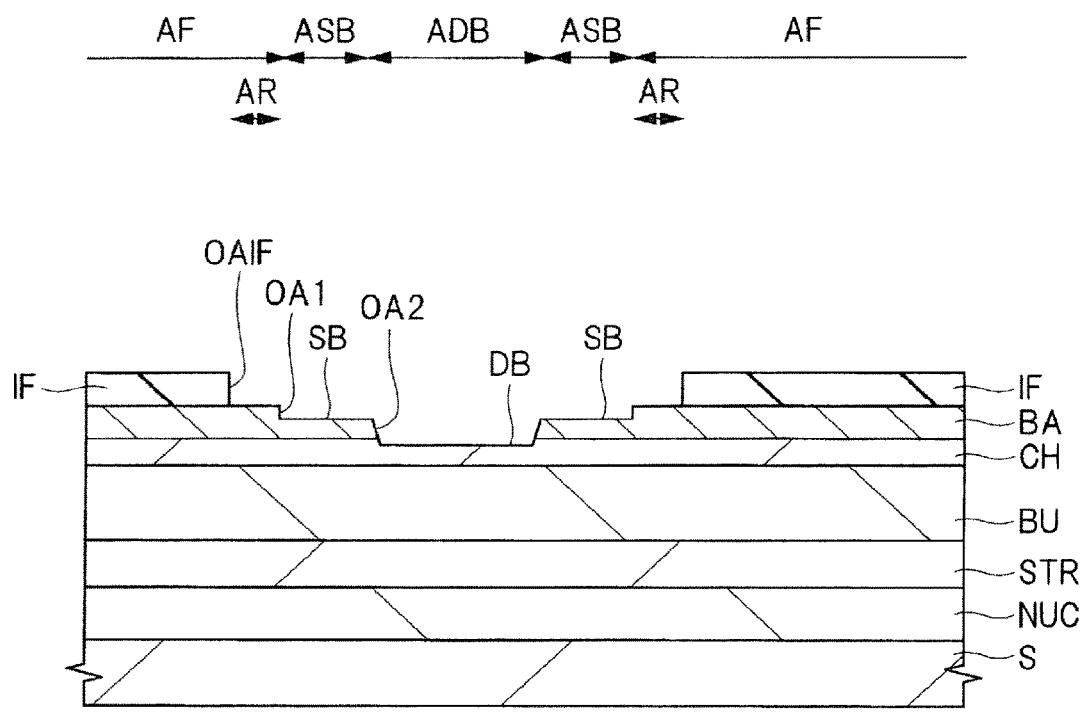
FIG. 48 is a sectional view illustrating a manufacturing step following FIG. 47 of the semiconductor device of the fifth embodiment.

Consequently, as illustrated in FIG. 48, the opening OAIF, the opening OA2, and the opening OA1 are formed. The bottom face of the opening OAIF corresponds to the surface of the barrier layer BA, the bottom face of the opening OA2 corresponds to the shallow bottom portion SB, and the bottom face of the opening OA1 corresponds to the deep bottom portion DB. As described above, the opening OAIF is formed so as to enclose the opening OA1, and the opening OA1 is formed so as to enclose the opening OA2.

Subsequently, as illustrated in FIG. 44, the gate electrode GE is formed over the insulating film IF and over the inside of each of the openings OAIF, OA2, and OA1 with the gate insulating film GI in between. The gate insulating film GI and the gate electrode GE can each be formed using the same material and in the same way as in the first embodiment.

Subsequently, the interlayer insulating film IL1 is formed over the insulating film IF and the gate electrode GE, and then the source electrode SE and the drain electrode DE are formed. Subsequently, the interlayer insulating film IL2 is formed over the interlayer insulating film IL1, the source electrode SE, and the drain electrode DE. The interlayer insulating film IL1, the source electrode SE, the drain electrode DE, and the interlayer insulating film IL2 can each be formed using the same material and in the same way as in the first embodiment. Subsequently, as described in the first embodiment, plugs (PG) and interconnections (such as source lines SL and drain lines DL) are formed. A protective film may be formed on the top interconnection.

The semiconductor device of the fifth embodiment can be formed through the above-described steps. Such steps are merely an example, and the semiconductor device of the fifth embodiment may be manufactured through other steps.

In the fifth embodiment, the insulating film IF may be retracted only toward the drain electrode DE.

Sixth Embodiment

Figure 49:
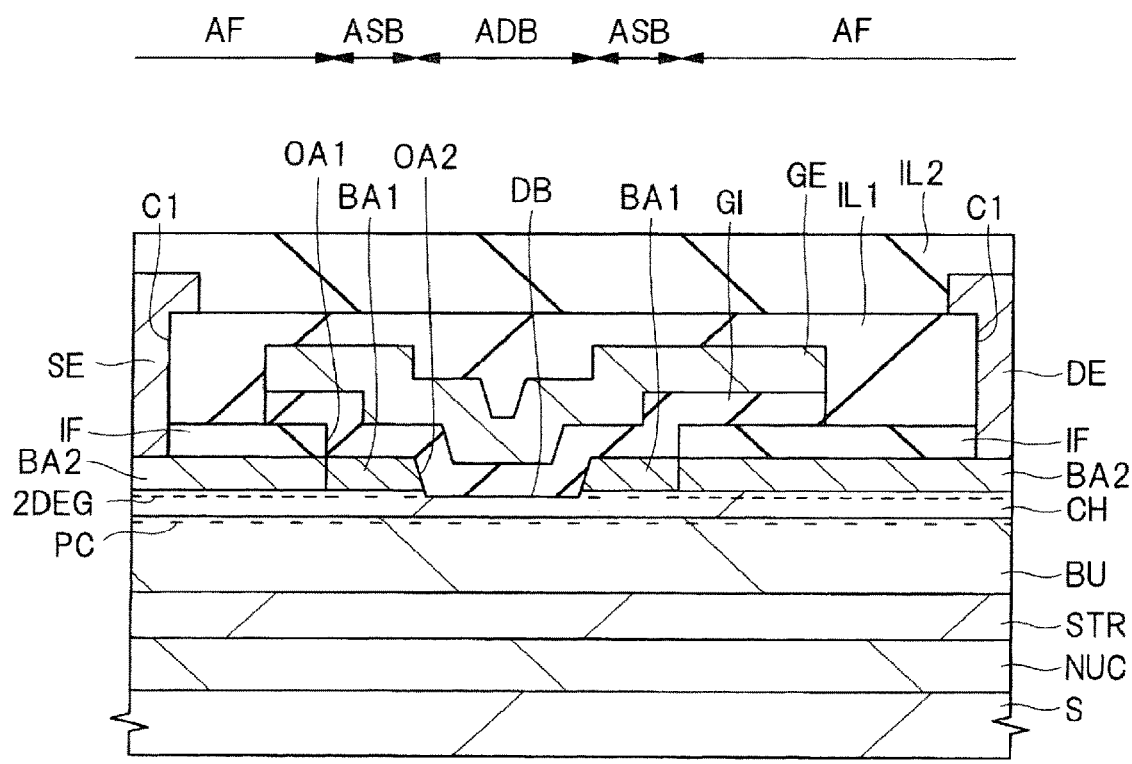
FIG. 49 is a sectional view illustrating a configuration of a semiconductor device of a sixth embodiment.

FIG. 49 is a sectional view illustrating a configuration of a semiconductor device of a sixth embodiment. As illustrated in FIG. 49, in a possible configuration, the low-Al barrier layer BA1 is provided in a region on either side of the opening OA2 (a region corresponding to the region ASB in the first embodiment), while the high-Al barrier layer BA2 is provided in a region on either side of the opening OA1 (a region corresponding to the region AF in the first embodiment). Components similar to those in the first embodiment are designated by the similar numerals, and duplicated description is omitted.

In such a configuration, the concentration of the two-dimensional electron gas 2DEG below the low-Al barrier layer BA1 can also be controlled to be lower than the concentration of the two-dimensional electron gas 2DEG below the high-Al barrier layer BA2. Consequently, as described in detail in the first embodiment and others, a decrease in threshold potential can be prevented, and thus normally-off operability is improved.

Although the invention achieved by the inventors has been described in detail according to some embodiments thereof hereinbefore, the invention should not be limited thereto, and it will be appreciated that various modifications or alterations thereof may be made within the scope without departing from the gist of the invention. For example, the buffer layer described in the fifth embodiment may be a p-type buffer layer as described in the application 1 of the first embodiment. The buffer layer described in the fifth embodiment may not be provided as described in the application 2 of the first embodiment. In addition, the configurations of the device portions and/or the manufacturing steps described in the embodiments can be variously combined with one another.

Supplementary Note 1

A method of manufacturing a semiconductor device, the method including the steps of:

(a) forming a first nitride semiconductor layer over a substrate;

(b) forming a second nitride semiconductor layer over the first nitride semiconductor layer;

(c) forming a third nitride semiconductor layer over the second nitride semiconductor layer;

(d) forming a trench including a first opening that runs up to the middle of the second nitride semiconductor layer through the third nitride semiconductor layer in a first region, and a second opening that runs up to the middle of the third nitride semiconductor layer in a second region;

(e) forming a gate electrode in the trench with a gate insulating film in between; and (f) forming a first electrode over the third nitride semiconductor layer on a first side of the gate electrode, and forming a second electrode over the third nitride semiconductor layer on a second side of the gate electrode, where the second nitride semiconductor layer has an electron affinity larger than each of the first nitride semiconductor layer and the third nitride semiconductor layer, and where the first nitride semiconductor layer has an electron affinity larger than the third nitride semiconductor layer.

Supplementary Note 2

The method according to the supplementary note 1, where the first nitride semiconductor layer contains a p-type impurity.

Supplementary Note 3

The method according to the supplementary note 1, further including the step of, between the step (c) and the step (d), forming an insulating film over the third nitride semiconductor layer.

Supplementary Note 4

The method according to the supplementary note 3, where the step (d) is a step of forming the first opening, the second opening, and a third opening that runs through the insulating film and encloses the second opening, and where the step (e) is a step of forming the gate electrode over the insulating film and over the inside of each of the first opening, the second opening, and the third opening with the gate insulating film in between.

Supplementary Note 5

The method according to the supplementary note 1, where the step (c) further includes the steps of:

(c1) forming a first film over the second nitride semiconductor layer; and (c2) forming a second film over the first film, and where the step (d) is a step of forming a trench including a first opening that runs up to the middle of the second nitride semiconductor layer through the first film and the second film in the first region, and a second opening that runs up to the first film through the second film in the second region.

Supplementary Note 6

The method according to the supplementary note 5, where the first film and the second film each contain Al, and where the first film has an Al compositional ratio lower than the second film.

Supplementary Note 7

A method of manufacturing a semiconductor device, the method including the steps of:

(a) forming a first nitride semiconductor layer over a substrate;

(b) forming a second nitride semiconductor layer over the first nitride semiconductor layer;

(c) forming a third nitride semiconductor layer over the second nitride semiconductor layer;

(d) forming a first opening that runs up to the middle of the second nitride semiconductor layer through the third nitride semiconductor layer in a first region;

(e) forming a gate electrode in the first opening with a gate insulating film in between; and (f) forming a first electrode over the third nitride semiconductor layer on a first side of the gate electrode, and forming a second electrode over the third nitride semiconductor layer on a second side of the gate electrode;

where the step (c) further includes the steps of:

(c1) forming a first film over the second nitride semiconductor layer;

(c2) forming a second film over the first film; and before the step (d), leaving the second film only in a second region on either side of the first opening, where the second nitride semiconductor layer has an electron affinity larger than each of the first nitride semiconductor layer and the third nitride semiconductor layer, where the first nitride semiconductor layer has an electron affinity larger than the third nitride semiconductor layer, where the first film contains Al, and where the second film has an Al compositional ratio lower than the first film.

Supplementary Note 8

A semiconductor device, including:

a first nitride semiconductor layer provided over a substrate;

a second nitride semiconductor layer provided over the first nitride semiconductor layer;

a third nitride semiconductor layer provided over the second nitride semiconductor layer;

a first opening that runs up to the middle of the second nitride semiconductor layer through the third nitride semiconductor layer;

a gate electrode disposed in the first opening with a gate insulating film in between; and a first electrode and a second electrode each being provided over the third nitride semiconductor layer on either side of the gate electrode, where the second nitride semiconductor layer has an electron affinity larger than each of the first nitride semiconductor layer and the third nitride semiconductor layer, where the first nitride semiconductor layer has an electron affinity larger than the third nitride semiconductor layer, where a first region is disposed on either side of the first opening, and where the thickness of the third nitride semiconductor layer in the first region is thinner than the thickness of the third nitride semiconductor layer in a second region between an end of the first region on a side close to the first electrode and the first electrode.

Supplementary Note 9

A semiconductor device, including:
- a first nitride semiconductor layer provided over a substrate;
- a second nitride semiconductor layer provided over the first nitride semiconductor layer;
- a first opening that runs up to the middle of the first nitride semiconductor layer through the second nitride semiconductor layer;
- a gate electrode disposed in the first opening with a gate insulating film in between; and
- a first electrode and a second electrode each being provided over the second nitride semiconductor layer on either side of the gate electrode,
- where the first nitride semiconductor layer has an electron affinity larger than the second nitride semiconductor layer,
- where a first region is disposed on either side of the first opening, and
- where the thickness of the third nitride semiconductor layer in the first region is thinner than the thickness of the third nitride semiconductor layer in a second region between an end of the first region on a side close to the first electrode and the first electrode.

What is claimed is:

1. A method of manufacturing a semiconductor device, the method including the steps of:
   (a) forming a first nitride semiconductor layer over a substrate;
   (b) forming a second nitride semiconductor layer over the first nitride semiconductor layer;
   (c) forming a third nitride semiconductor layer over the second nitride semiconductor layer;
   (d) forming a trench including a first opening that runs up to the middle of the second nitride semiconductor layer through the third nitride semiconductor layer in a first region, and a second opening that runs up to the middle of the third nitride semiconductor layer in a second region;
   (e) forming a gate electrode in the trench with a gate insulating film in between; and
   (f) forming a first electrode over the third nitride semiconductor layer on a first side of the gate electrode, and forming a second electrode over the third nitride semiconductor layer on a second side of the gate electrode,
   wherein the second nitride semiconductor layer has an electron affinity larger than each of the first nitride semiconductor layer and the third nitride semiconductor layer, and
   wherein the first nitride semiconductor layer has an electron affinity larger than the third nitride semiconductor layer.

2. The method according to claim 1,
   wherein the first nitride semiconductor layer contains a p-type impurity.

3. The method according to claim 1, further including the step of, between the step (c) and the step (d), forming an insulating film over the third nitride semiconductor layer.

4. The method according to claim 3,
   wherein the step (d) is a step of forming the first opening, the second opening, and a third opening that runs through the insulating film and encloses the second opening, and
   wherein the step (e) is a step of forming the gate electrode over the insulating film and over the inside of each of the first opening, the second opening, and the third opening with the gate insulating film in between.

5. The method according to claim 1,
   wherein the step (c) further includes the steps of:
   (c1) forming a first film over the second nitride semiconductor layer; and
   (c2) forming a second film over the first film, and
   wherein the step (d) is a step of
   forming a trench including a first opening that runs up to the middle of the second nitride semiconductor layer through the first film and the second film in the first region, and a second opening that runs up to the first film through the second film in the second region.

6. The method according to claim 5,
   wherein the first film and the second film each contain Al, and
   wherein the first film has an Al compositional ratio lower than the second film.

7. A method of manufacturing a semiconductor device, the method including the steps of:
   (a) forming a first nitride semiconductor layer over a substrate;
   (b) forming a second nitride semiconductor layer over the first nitride semiconductor layer;
   (c) forming a third nitride semiconductor layer over the second nitride semiconductor layer;
   (d) forming a first opening that runs up to the middle of the second nitride semiconductor layer through the third nitride semiconductor layer in a first region;
   (e) forming a gate electrode in the first opening with a gate insulating film in between; and
   (f) forming a first electrode over the third nitride semiconductor layer on a first side of the gate electrode, and forming a second electrode over the third nitride semiconductor layer on a second side of the gate electrode;
   wherein the step (c) further includes the steps of:
   (c1) forming a first film over the second nitride semiconductor layer;
   (c2) forming a second film over the first film; and
   before the step (d), leaving the second film only in a second region on either side of the first opening,
   wherein the second nitride semiconductor layer has an electron affinity larger than each of the first nitride semiconductor layer and the third nitride semiconductor layer,
   wherein the first nitride semiconductor layer has an electron affinity larger than the third nitride semiconductor layer,
   wherein the first film contains Al, and
   wherein the second film has an Al compositional ratio lower than the first film.

8. A semiconductor device, including:
   a first nitride semiconductor layer provided over a substrate;
   a second nitride semiconductor layer provided over the first nitride semiconductor layer;
   a third nitride semiconductor layer provided over the second nitride semiconductor layer;
   a first opening that runs up to the middle of the second nitride semiconductor layer through the third nitride semiconductor layer;
   a gate electrode disposed in the first opening with a gate insulating film in between; and
   a first electrode and a second electrode each being provided over the third nitride semiconductor layer on either side of the gate electrode, wherein the second nitride semiconductor layer has an electron affinity larger than each of the first nitride semiconductor layer and the third nitride semiconductor layer, wherein the first nitride semiconductor layer has an electron affinity larger than the third nitride semiconductor layer, wherein a first region is disposed on either side of the first opening, and wherein the thickness of the third nitride semiconductor layer in the first region is thinner than the thickness of the third nitride semiconductor layer in a second region between an end of the first region on a side close to the first electrode and the first electrode.

9. A semiconductor device, including:
a first nitride semiconductor layer provided over a substrate;
a second nitride semiconductor layer provided over the first nitride semiconductor layer;
a first opening that runs up to the middle of the first nitride semiconductor layer through the second nitride semiconductor layer;
a gate electrode disposed in the first opening with a gate insulating film in between; and
a first electrode and a second electrode each being provided over the second nitride semiconductor layer on either side of the gate electrode, wherein the first nitride semiconductor layer has an electron affinity larger than the second nitride semiconductor layer, wherein a first region is disposed on either side of the first opening, and wherein the thickness of the third nitride semiconductor layer in the first region is thinner than the thickness of the third nitride semiconductor layer in a second region between an end of the first region on a side close to the first electrode and the first electrode.

* * * * *